(12) United States Patent
Miyazaki et al.

(10) Patent No.: US 8,464,139 B2
(45) Date of Patent: Jun. 11, 2013

(54) RECEIVING DEVICE AND DECODING METHOD THEREOF

(75) Inventors: Shunji Miyazaki, Kawasaki (JP);
Kazuhisa Obuchi, Kawasaki (JP);
Norihiro Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 956 days.

(21) Appl. No.: 12/360,477

(22) Filed: Jan. 27, 2009

(65) Prior Publication Data

US 2009/0132893 A1 May 21, 2009

Related U.S. Application Data

(63) Continuation of application No. PCT/JP2006/315287, filed on Aug. 2, 2006.

(51) Int. Cl.
*H03M 13/00* (2006.01)

(52) U.S. Cl.
USPC .......................................................... 714/776

(58) Field of Classification Search
USPC .......................................................... 714/776
See application file for complete search history.

(56) References Cited

U.S. PATENT DOCUMENTS

| | | | |
|---|---|---|---|
| 6,182,261 B1 * | 1/2001 | Haller et al. | 714/758 |
| 6,252,917 B1 | 6/2001 | Freeman | |
| 6,888,901 B2 | 5/2005 | Yu et al. | |
| 7,113,554 B2 | 9/2006 | Dielissen et al. | |
| 2002/0026618 A1 * | 2/2002 | Wang | 714/786 |
| 2002/0120902 A1 * | 8/2002 | Brown | 714/776 |
| 2002/0136332 A1 | 9/2002 | Dielissen et al. | |
| 2003/0106012 A1 * | 6/2003 | Hewitt | 714/780 |
| 2006/0013341 A1 * | 1/2006 | Suzuki | 375/340 |
| 2007/0124652 A1 * | 5/2007 | Litsyn et al. | 714/776 |

FOREIGN PATENT DOCUMENTS

| | | |
|---|---|---|
| DE | 102 14 393 | 2/2003 |
| DE | 10214393 | 2/2003 |
| EP | 0973292 | 1/2000 |
| EP | 973292 A2 * | 1/2000 |
| JP | 2001-196943 | 7/2001 |

(Continued)

OTHER PUBLICATIONS

Japanese Patent Office "Notification of Reason for Refusal" issued for corresponding Japanese Patent Application No. 2008-527616, dispatched Aug. 30, 2011. English translation attached.

(Continued)

*Primary Examiner* — Albert Decady
*Assistant Examiner* — Enam Ahmed
(74) *Attorney, Agent, or Firm* — Myers Wolin, LLC

(57) ABSTRACT

A receiving device in a communication system that separates one frame of information bits into plural blocks, performs turbo encoding of the information bits of each block and transmits the result, and decodes the encoded information bits, where the receiving device includes plural decoders number of which is less than the number of blocks per frame. Each decoder performs a decoding process on encoded information bits of each block that have been expressed by likelihood, when a condition for stopping decoding is met, executes the decoding process of encoded information bits of another block for which decoding has not yet been performed. When the condition for stopping decoding has been met for all blocks before the number of times decoding has been performed for each decoder reaches a preset maximum number of repetitions, the decoding results of all the blocks are serially combined, an error detection process is executed.

19 Claims, 24 Drawing Sheets

FOREIGN PATENT DOCUMENTS

| | | |
|---|---|---|
| JP | 2002-016504 | 1/2002 |
| JP | 2004-088388 | 3/2004 |
| JP | 2004-519886 | 7/2004 |
| JP | 2005-203959 | 7/2005 |
| WO | 02/01730 | 1/2002 |
| WO | 02/067435 | 8/2002 |

OTHER PUBLICATIONS

Extended European Search Report for corresponding European Patent Application No. 06782156.1 issued on Aug. 12, 2011.

3GPP TS 25.212 V5.2.0 (Sep. 2002), 3rd Generation Partnership Project; Technical Specification Group Radio Access Network; Multiplexing and channel coding (FDD) (Release 5).

Dobkin, et al., "Parallel VLSI Architecture for Map Turbo Decoder", Personal, Indoor and Mobile Radio Communications, 2002, The 13th IEEE International Symposium on Sep. 15-18, 2002, IEEE, vol. 1, pp. 384-388.

Korean Intellectual Property Office "Notice of Preliminary Rejection" issued for corresponding Korean Patent Application No. 10-2008-7026516, mailed on Aug. 25, 2010. English translation attached.

International Search Report for the corresponding International Application No. PCT/JP2006/315287, date of completion Sep. 6, 2006.

3GPP TS 25.212 V5.9.0 (Jun. 2004) 3rd Generation Partnership Project; Technical Specification Group Radio Access Network; Multiplexing and channel coding (FDD) (Release 5); Jun. 2004.

Official Office Communication issued for corresponding European Patent Application No. 06 782 156.1 dated May 11, 2012.

3rd Generation Partnership Project; Technical Specification Group Radio Access Network; Multiplexing and channel coding (FDD) (Release 5); 3GPP TS 25.212 V5.2.0; Sep. 2002.

* cited by examiner

FIG. 10
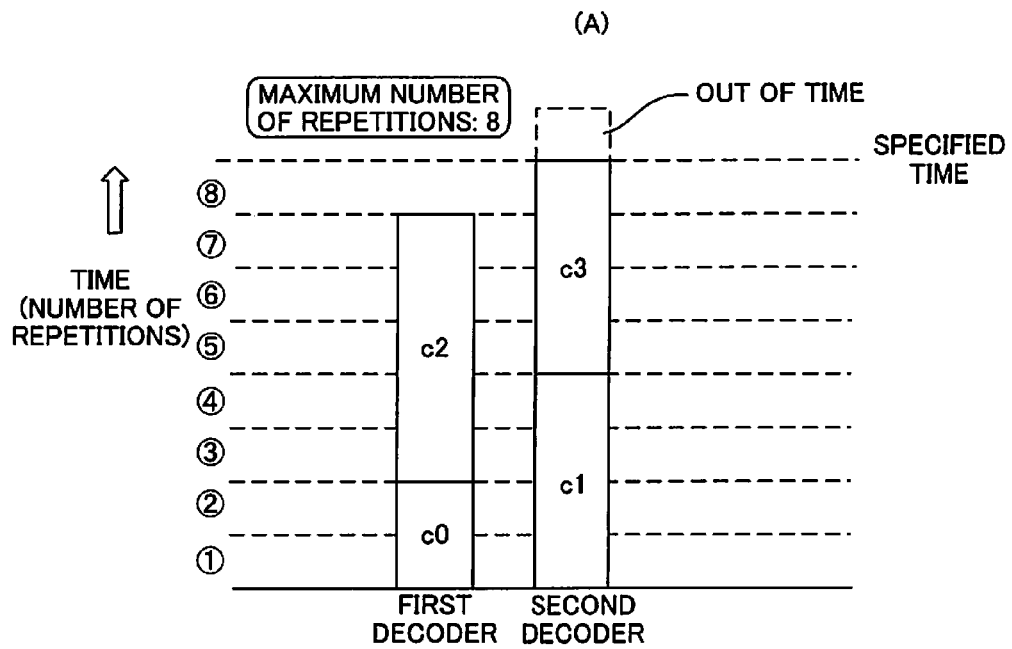
(A)
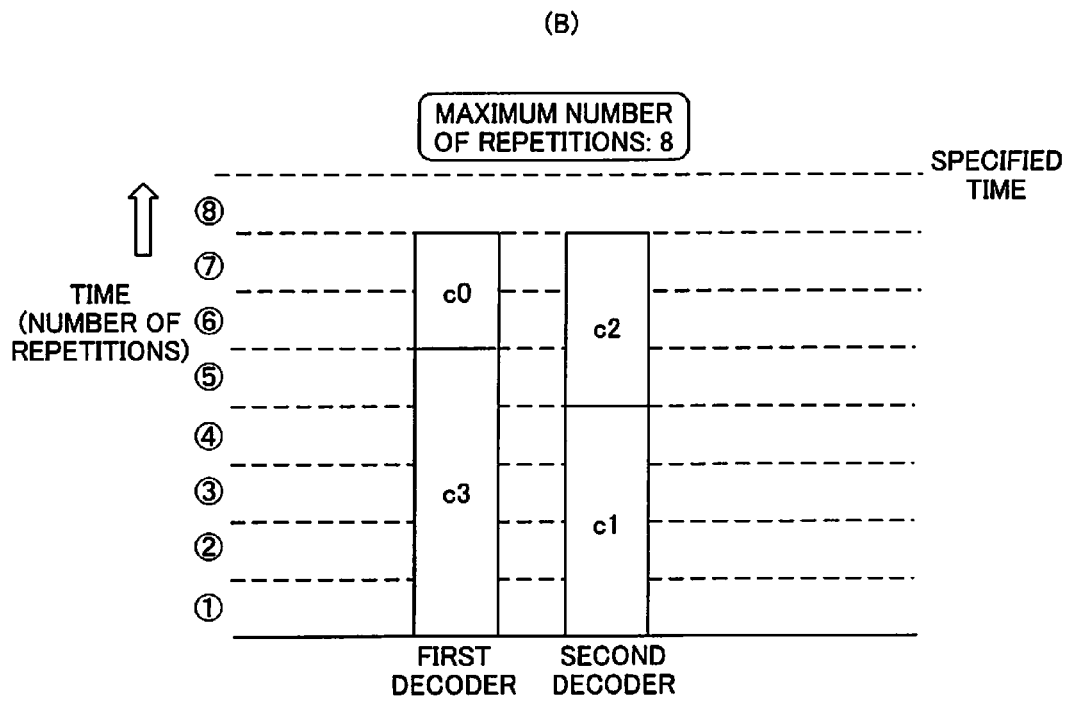
(B)

RECEIVING DEVICE AND DECODING METHOD THEREOF

CROSS-REFERENCE TO RELATED APPLICATION

This application is a continuation application of international PCT application No. PCT/JP2006/315287 filed on Aug. 2, 2006.

BACKGROUND OF THE INVENTION

The present invention relates to a receiving device and the decoding method thereof, and may be related to a receiving device and the decoding method thereof in a communication system in which a transmitter separates the information bits of one frame into plural code blocks, encodes the information bits of each code block using code that reduces errors in the decoding results each time decoding process is repeated and transmits the results, and the receiving device receives the encoded information bits of each code block, and decodes the encoded information bits to the information bits before encoding.

In a communication system, a transmitter performs an encoding process on transmission data, then transmits the obtained encoded data via a transmission path, and a receiver performs an error-correction/decoding process on the signal received from the transmission path and decodes the transmission data. FIG. 23 shows an example of this kind of communication system, where the transmitter 1 includes: an encoding unit 1a that encodes information u which is comprised of K bits and generates N bits of block code x as shown in FIG. 24; and a modulation unit 2a that modulates and transmits that block code. The receiver 2 includes: a demodulation unit 2a that demodulates a signal that is received via a transmission path 3; and a decoding unit 2b that decodes the original transmitted K bits of information from the N bits of received information.

The encoding unit 1 includes: a parity generation unit 1c that generates M (=N−K) number of parity bits p, and a P/S conversion unit 1d that combines K bits of information u and M bits of parity bits p, and outputs N (=K+M) bits of block code x. A Turbo code is utilized as a code in the encoding unit 1a. The decoding unit 2b includes: a decoder 2c that performs an error-correction process on the received likelihood data y that is output from the demodulation unit 2a, decodes the original transmitted K bits of information and outputs the estimation information. The block code x that was transmitted from the transmitter 1 suffers from the effect of the transmission path and is not input to the decoder 2c in the state that it was transmitted, but is input to the decoder as likelihood data. The likelihood data is made up of reliability as to whether the code bit is 0 or 1, and the code (0 if +1, and 1 if −1). The decoder 2c performs a specified decoding process on each code bit based on the likelihood data, to estimate the information bits u. The decoder 2c performs Maximum A Posteriori Probability Decoding (MAP Decoding) in the case of turbo code.

FIG. 25 is a schematic diagram of a turbo encoding unit 1a, and FIG. 26 is a schematic diagram of a turbo decoding unit 2b. Turbo code is systematic code having an encoding rate of ⅓, and by using MAP decoding, it is possible to reduce errors in the decoded results each time decoding is repeated.

In FIG. 25, u=[u0, u1, u2, u3, . . . , $u_{K-1}$] is the transmitted information data having a length K; xa, xb, and xc are encoded data resulting from encoding the information data u in the turbo encoding unit 1a; ya, yb and yc are reception signals that are the encoded data xa, xb and xc that have propagated along the communication path 3 and have suffered from the effect of noise and fading; and u' is the decoding result from decoding of the reception data ya, yb and yc by the turbo decoding unit 2b. In the turbo encoding unit 1a, encoded data u is the information data u itself, encoded data xb is the information data xa that has been convolved and encoded by an element encoder ENC1, and encoded data xc is the information data u that has been interleaved (π), then convolved and encoded by an element encoder ENC2. In other words, turbo code is systematic code obtained by the combination of two convolutions, where xa is the information bits and xb, xc are the parity bits. The P/S conversion unit 1d converts the encoded data xa, xb and xc to serial data and outputs the result.

In the turbo decoding unit 2b that is shown in FIG. 26, a first element decoder DEC1 uses ya and yb from among the reception signals ya, yb and yc to perform decoding. The first element decoder DEC1 is an element decoder for soft-decision output, and outputs the likelihood of the decoding result. Next, the second element decoder DEC2 uses the likelihood that is output from the first element decoder DEC1 and yc to perform similar decoding. The second element decoder DEC2 is also an element decoder for soft-decision output, and outputs the likelihood of the decoding results. In this case, since yc is a reception signal that corresponds to xc, which is the original data u that has been interleaved and encoded, the likelihood that is output from the first element decoder DEC1 is interleaved (π) before it is input to the second element decoder DEC2. The likelihood that is output from the second element decoder DEC2 is interleaved ($\pi^{-1}$), thereafter it is fed back as input to the first element decoder DEC1. The hard-decision result '0', '1' of the de-interleaved result from the second element decoder DEC2 becomes the turbo decoding result (decoded data) u'. After that, by repeating the decoding operation described above a specified number of times, the error rate of the decoding result u' is reduced. It is possible to use MAP element decoders as the first and second element decoders DEC1, DEC2 in the turbo decoding unit.

As a concrete example of the communication system shown in FIG. 23 is a 3GPP W-CDMA mobile communication system. In this 3GPP W-CDMA mobile communication system, the transmitter is a radio base station, and the receiver is a mobile station (mobile terminal).

FIG. 27 is a block diagram of the data transmission processing unit in a radio base station and is a drawing explaining the operation thereof (refer to 3GPP, TS25.212 v5.9.0). After receiving information data D1 that is to be transmitted from the host layer in frame units, a CRC attachment unit 11 performs attaching CRC (Cyclic Redundancy Check) to the data D1 for detecting error using CRC. Next, a code block separation unit 12 separates the information D2 to which CRC code has been attached into a plurality of code blocks (Code Block Segmentation); here there are four code block, s0, s1, s2 and s3. An encoding unit 13 performs turbo encoding, for example, and encodes each of the code blocks. By doing this, code block s0 becomes turbo encoded code block (s0, p0, q0), code block s1 becomes turbo encoded code block (s1, p1, q1), code block s2 becomes turbo encoded code block (s2, p2, q2) and code block s3 becomes turbo encoded code block (s3, p3, q3). A code block combining unit 14 divides each of the code blocks that are output from the encoding unit 13 into systematic bits si (i=0 to 3), first parity bits pi and second parity bits qi, and serially connects similar type bits together. A puncturing unit 15 performs puncturing of the parity p and parity q so that the overall bit length of the combined code block data D3 becomes a specified size in the case where it exceeds the specified size. After that, a physical channel separation unit (not shown in the figure) separates the punctured data D4 into physical channels (Physical Channel Segmentation), then performs specified processing and gives the result to a modulation unit. The systematic bits si (i=0 to 3), the first parity bits pi and second parity bits qi correspond to the encoded data xa, ya and yc in FIG. 25.

FIG. 28 is a schematic diagram of a receiver in a mobile terminal. In MAP decoding, the data reliability of the posteriori likelihood increases each time the decoding process is repeated, and the error rate of decoded bits is improved, so the error rate is determined from the maximum number of repetitions per code block of the decoding process. On the other hand, the maximum number of repetitions is determined based on a specified amount of time that is assigned for the decoding process, so the same number of decoders $21_1$, $21_2$, $21_3$, $21_4$ as the number of the code blocks c0, c1, c2 and c3 are mounted as shown in FIG. 28 and the decoding process of the specified number of repetitions is completed within the specified amount of time. The specified amount of time that is assigned to the decoding process is determined from the maximum transmission speed.

FIG. 29 is an example of the case where the maximum number of repetitions is 8, and the error becomes '0' after the first decoder $21_1$ performs the decoding process 2 times for a specified code block, the error becomes '0' after the second decoder $21_2$ performs the decoding process 8 times, the error becomes '0' after the third decoder $21_3$ performs the decoding process 4 times, and the error becomes '0' after the fourth decoder $21_4$ performs the decoding process 3 times. An error occurs when the error does not become '0' even after repeating the decoding process the maximum number of times (out of time).

A pre-processing unit (not shown in the figure) executes processing which is reverse of the processing on the transmitting side for demodulated reception likelihood data, and acquires likelihood data (s0', p0', q0'), (s1', p1', q1'), (s2', p2', q2'), (s3', p3', q3') that corresponds to each of the respective encoded code blocks on the transmitting side, then saves the results in a buffer 22. Each of the decoders $21_1$, $21_2$, $21_3$, $21_4$ includes the construction shown in FIG. 26, and they perform the MAP decoding process for the reception likelihood data of each respective code blocks c0, c1, c2, c3 at the same time. When the decoding process operates normally, the data reliability of the posteriori likelihood increases each time the decoding process is repeated, and the error rate of the decoded bits improves. After the decoding process has been performed a specified number of times, a decoding result combining unit 23 serially combines the decoding results from each decoder in order to generate a decoded bit sequence, and inputs the result to a CRC check unit 24. The CRC check unit 24 performs a CRC check process on the decoded bit sequence, determines whether there is error or not, and when no error is detected, outputs that decoded bit sequence.

In MAP decoding, the data reliability of the posteriori likelihood increases each time the decoding process is repeated, and the error rate of the decode bits improves, so as shown in FIG. 30, often error is eliminated in all of the decoders before reaching the maximum number of repetitions. However, in conventional processing, there is a problem in that the processing time in order to perform the decoding process the maximum number of repetitions becomes long, and the consumed power becomes high.

Therefore, a method has been disclosed (refer to Japanese Patent No. 3556943) that monitors the decoding results of the decoders after each time the decoding process is performed to determine whether error has been eliminated, and stops the decoding process of a decoder for which it is determined that there is no error (error free). With this method, it is possible to shorten the processing time and reduce the consumed power. However, since a conventional receiver has the same number of decoders as the number of code blocks, there is a problem in that the scale of the circuit becomes large.

SUMMARY OF THE INVENTION

Taking the aforementioned problem into consideration, it is the object of the present invention to prevent a worsening of the error characteristics even though the number of mounted decoders is reduced.

Another object of the present invention is to perform a decoding process for a plural of code blocks by one decoder.

The present invention is a receiving device and a decoding method thereof in a communication system in which a transmitter separates one frame of information bits into plural of blocks, encodes the information bits of each block using code that reduces errors in the decoding results after each time decoding process is repeated and transmits blocks, and the receiving device receives the encoded information bits of each block, and decodes the encoded information bits to the information bits before encoding.

The decoding method of the present invention includes: a step of providing a receiving device with plural of decoders number of which is less than the number of blocks per frame, and presetting a maximum number of repetitions that decoding is performed by each decoder; a step of expressing the encoded information bits of each received block using likelihood in each decoder; a step of performing a decoding process on the encoded information bits of each received block expressed by likelihood, and judging whether a condition for stopping decoding has been met after each decoding process; and a step of saving the decoding results when the condition for stopping decoding has been met, and executing the decoding process for the encoded information bits of a different block for which the decoding process has not yet been performed.

The decoding method above further includes: a step of measuring the reliability of the encoded information bits expressed by likelihood for each block; and a step of performing in each decoder a decoding process on the encoded information bits of each block in order of lowest reliability.

The decoding method above further includes: a step of serially combining the decoding result of each block when the condition for stopping decoding for each block is met before the number of times the decoding process has been repeated by each decoder exceeds said preset maximum number of repetitions, and performing an error detection process on the combined decoding results; and a step of outputting the combined decoding results when there were no errors detected in the error detection process.

The decoding method above further comprising: a step of repeating in each decoder the decoding process for each assigned block in order until the number of times decoding has been repeated reaches the preset maximum number of repetitions when an error is detected in the error detection process; a step of serially combining the decoding results of each block after the number of times the decoding process has been repeated has reached the preset maximum number of repetitions, and performing an error detection process on the combined decoding results; and a step of outputting the serially combined decoding results when no errors are detected in the error detection process.

The decoding method above further comprising: a step of serially combining the decoding result of a remaining block with decoding result of other blocks after the conditions for stopping decoding have been met for all blocks except one remaining block, every time the decoding process has been performed for the remaining block; and a step of performing an error detection process for the combined decoding results and outputting the serially combined decoding results when no errors are detected in the error detection process.

The decoding method above further comprising: a step of causing the decoders to start the decoding process in order after the decoding process becomes possible for the encoded information bits of each block, and a step of increasing the maximum number of repetitions of the decoder that starts the decoding process at first more than the maximum number of repetitions of other decoders.

The decoding method above further comprising a step of, when the transmission device attached error detection codes to all of the blocks except one block, and then attached one error detection codes to the entire frame, using that error detection code to determine whether the condition for stopping decoding of the block is met, and judging the output of the decoding results.

The present invention is a receiving device in a communication system in which transmitter separates one frame of information bits into a plural of blocks, encodes the information bits of each block using code that reduces errors in the decoding results after each time decoding process is repeated, and transmits the blocks, and the receiving device receives the encoded information bits of each block, and decodes the encoded information bits to the information bits before encoding, comprising: a demodulation unit that outputs the received encoded information bits for each block as likelihood data; plural decoders number of which is less than the number of blocks per frame, where each decoder performs a decoding process on the encoded information bits expressed by likelihood for each block; a decoding stop judgment unit that judges whether a condition for stopping decoding has been met after each decoding process by each decoder; a control unit that assigns the decoding process for a different block for which decoding has not yet been performed to a decoder in which the condition for stopping decoding has been met; a decoding results combining unit that serially combines the decoding result of each block when the condition for stopping decoding for each block is met before the number of times the decoding has been repeated by each decoders exceeds a preset maximum number of repetitions; and an error detection unit that performs an error detection process on the combined decoding results, and when no error is found in the error detection process, outputs the combined decoding results.

The receiving device above further comprising a reliability measurement unit that measures the reliability of the encoded information bits that are expressed by likelihood for each block; wherein the control unit assigns the decoding process of each of the blocks to the decoders in order of blocks having the lowest reliability.

BRIEF DESCRIPTION OF THE DRAWINGS

FIG. 10 is a drawing for explaining the theory of a fourth embodiment.

DESCRIPTION OF THE PREFERRED EMBODIMENTS (A) Theory of the Present Invention

Figure 1:
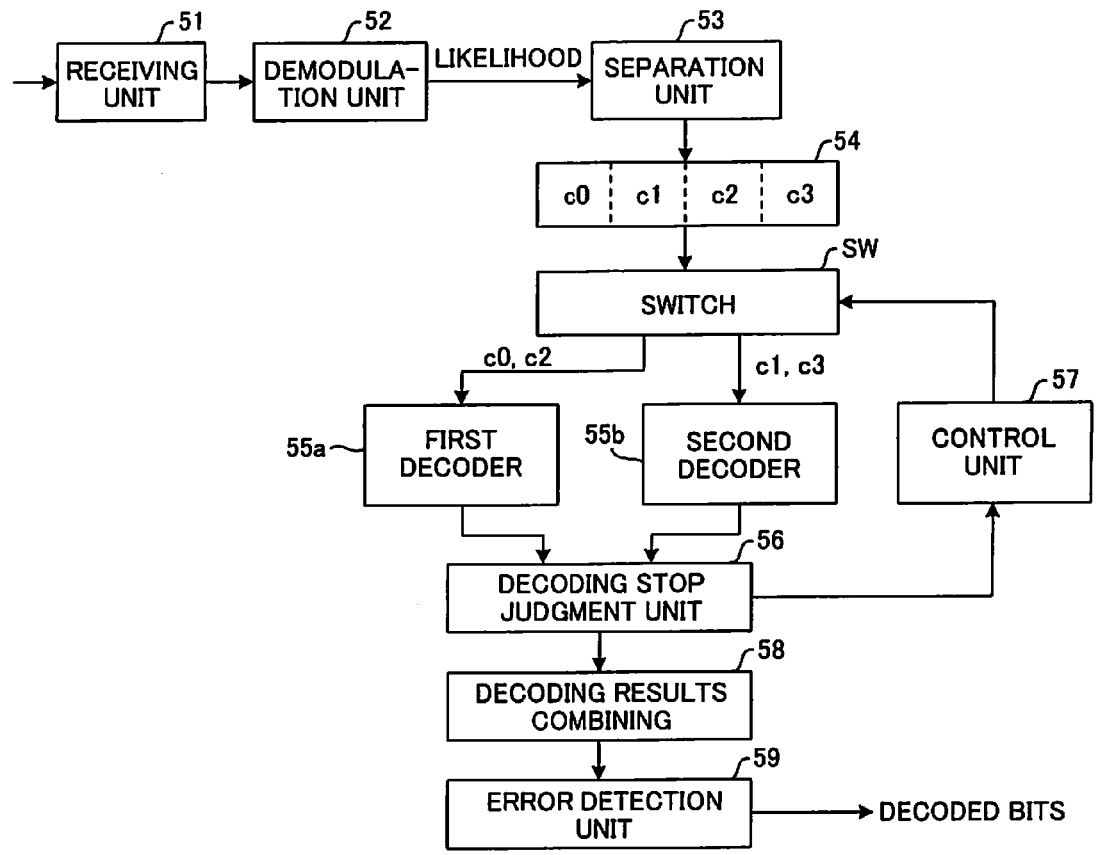
FIG. 1 is a schematic diagram for explaining the theory of the present invention.
Figure 2:
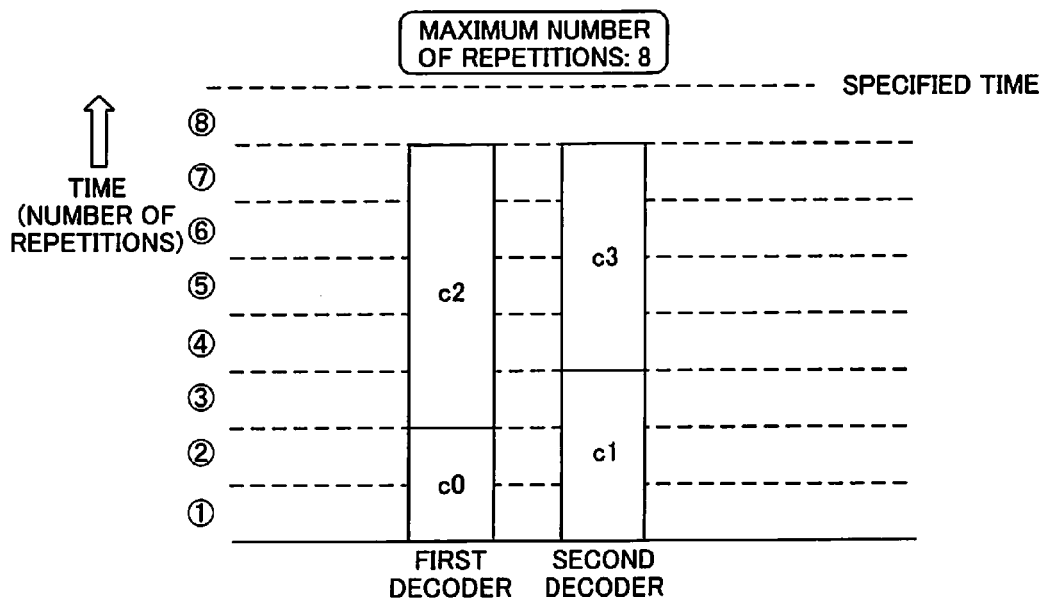
FIG. 2 is a drawing for explaining the processing by a decoder in order to explain the theory of the present invention.

FIG. 1 and FIG. 2 are drawings for explaining the theory of the present invention.

Figure 27:
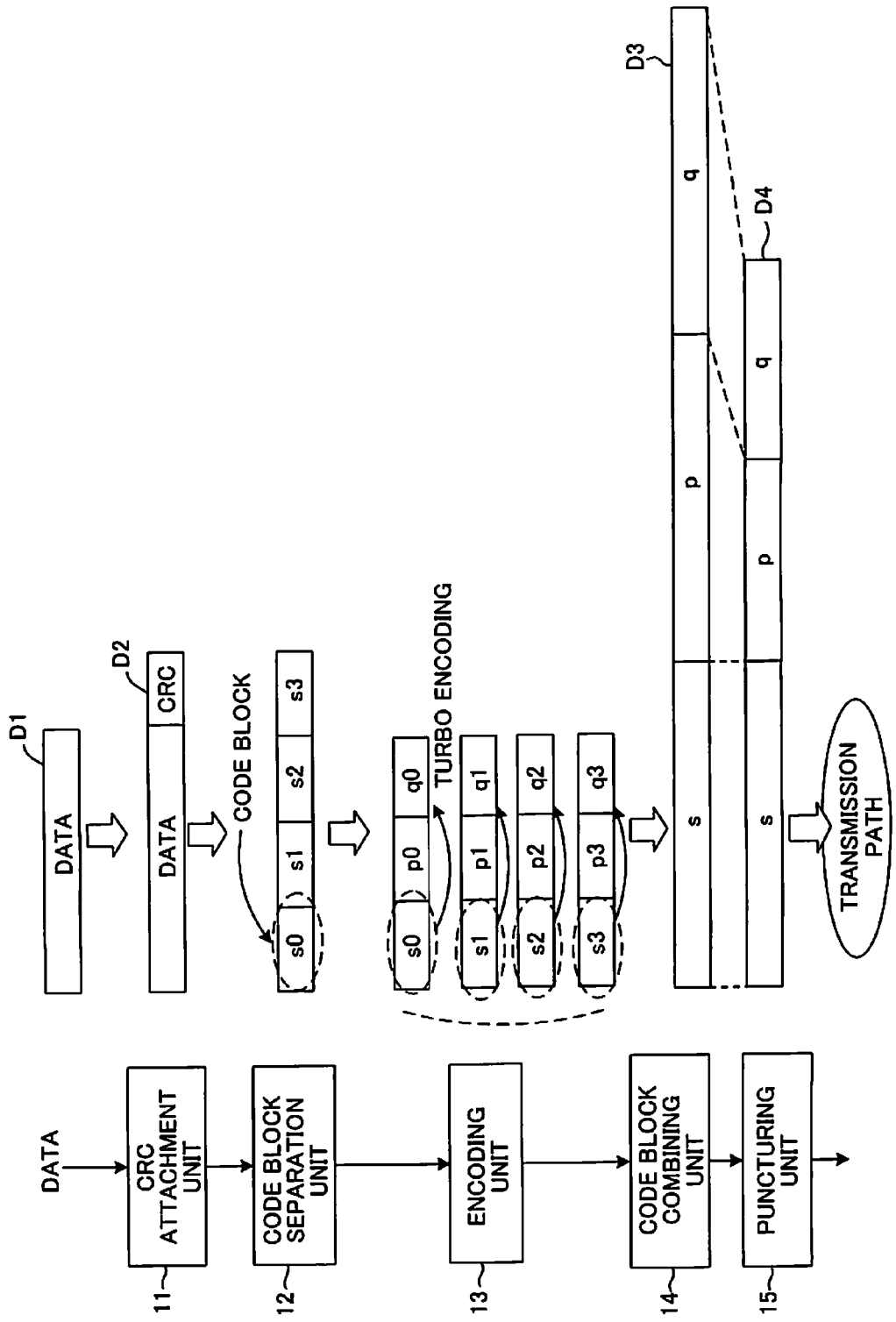
FIG. 27 is a block diagram of a data transmission processing unit in a radio base station and is a drawing explaining the operation thereof.
Figure 28:
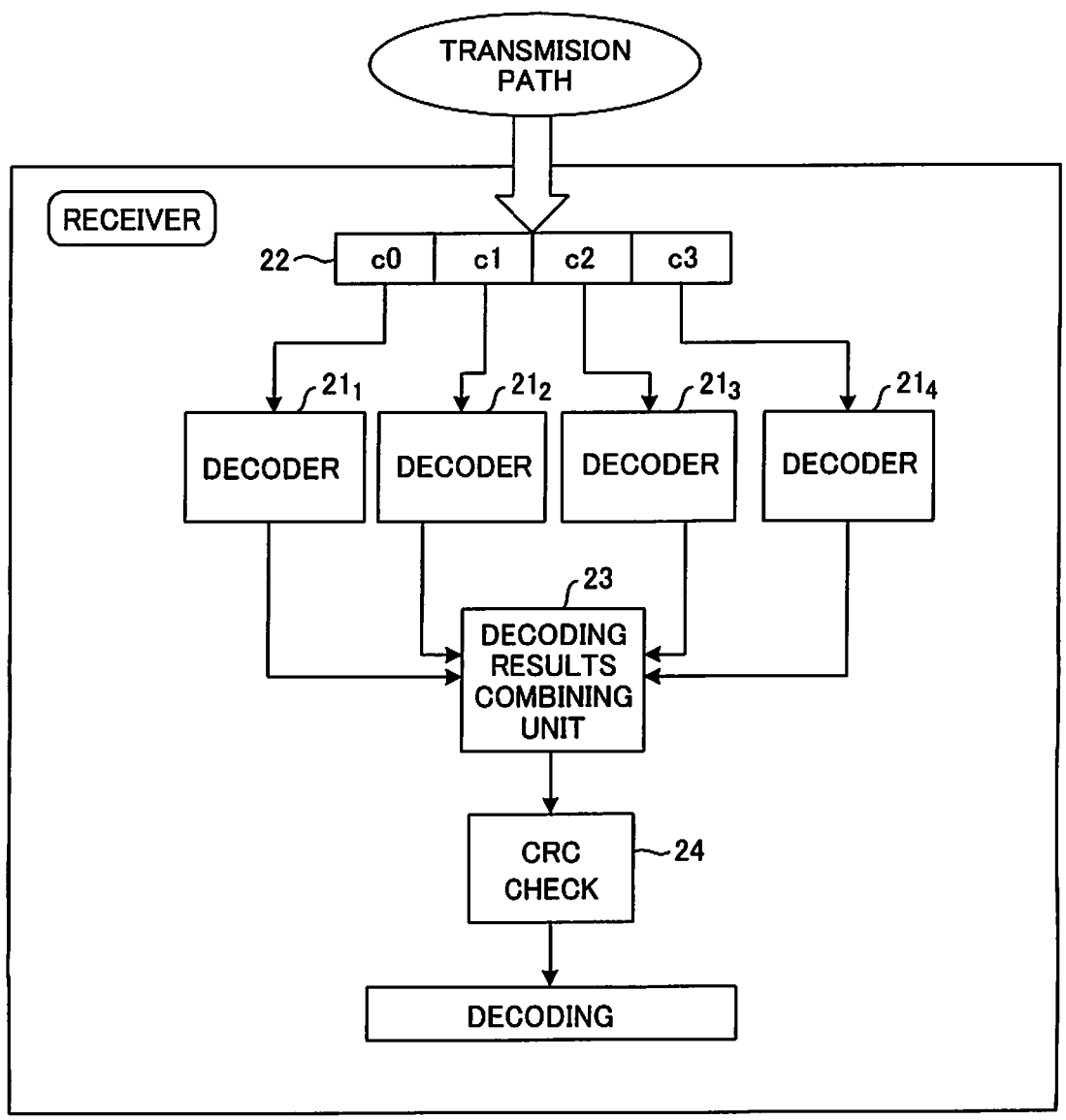
FIG. 28 is a schematic diagram of a receiver in a mobile terminal.
Figure 29:
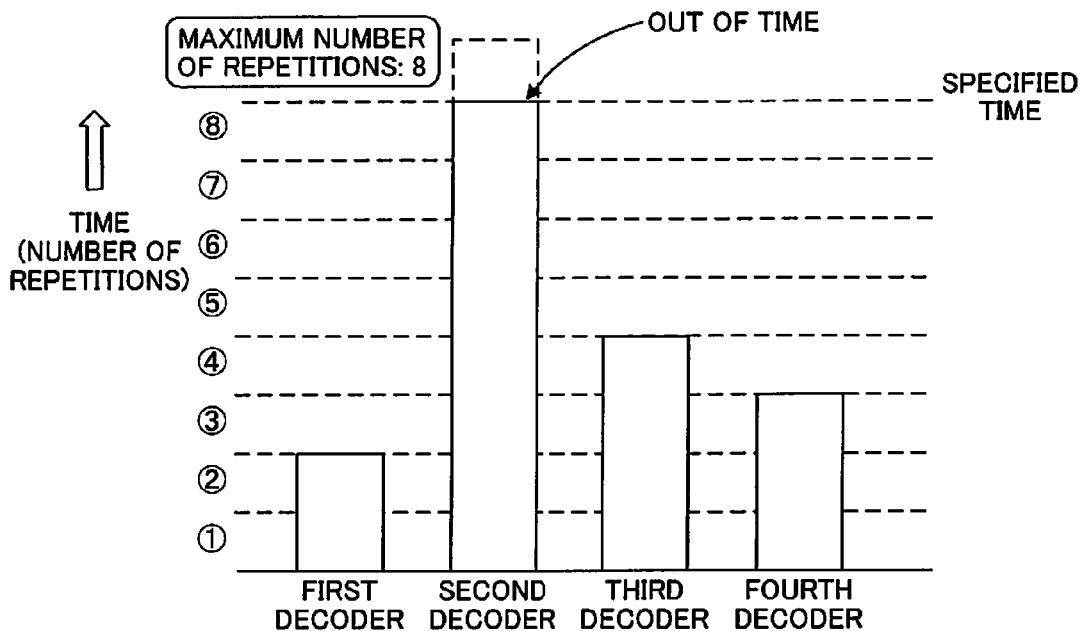
FIG. 29 shows a first example of decoding process when the maximum number of repetitions is 8.
Figure 30:
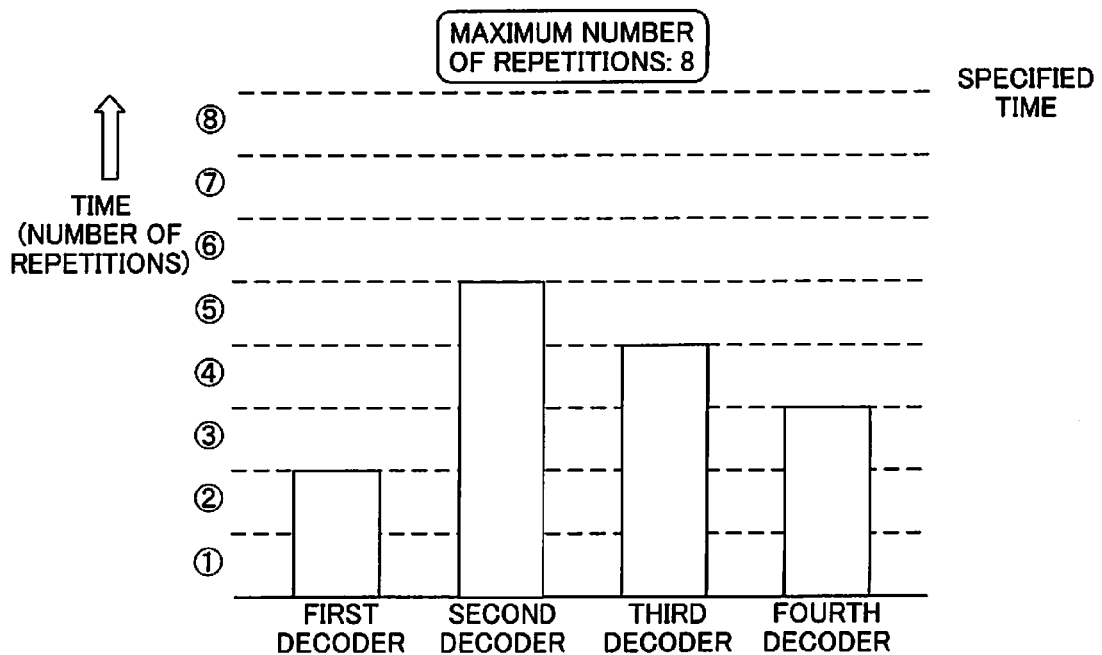
FIG. 30 shows a second example of decoding process when the maximum number of repetitions is 8.

A transmission device (not shown in the figure) separates one frame of information bits into a plural of code blocks, for example four code blocks s0 to s3 as explained using FIG. 27, then encodes the information bits of each code block into turbo code and transmits the result. Here, CRC error detection code is included in one frame of information bits.

A receiving unit 51 of a receiving device 50 inputs a received signal to a demodulation unit 52, and the demodulation unit demodulates the encoded information bits that are included in the received signal and outputs the result as likelihood data (soft-decision data), then a separation unit 53 separates one frame of likelihood data into code blocks c0 to c3 and saves the results in a buffer unit 54. The receiving device 50 is provided with plural of turbo decoders number of which is less than the number of code block per frame (=4), for example two, first and second turbo decoders 55a, 55b. As shown in FIG. 2, the first and second turbo decoders 55a, 55b perform a decoding process on the encoded information bits expressed as likelihood in the respective code blocks c0, c1 at first. A decoding stop judgment unit 56 judges after each decoding process whether a condition for stopping decoding has been met, and when the condition for stopping decoding has been met for the first decoder 55a, a control unit 57 controls a switch SW and assigns the decoding process of a different code block c2 which has not yet been performed to that first decoder 55a, then when the condition for stopping decoding has been met for the second decoder 55b, assigns the decoding process of a different code block c3 which has not yet been performed to that second decoder 55b.

In the case where the conditions for stopping decoding of all of the code block c0 to c3 have been met for the first and second decoders 55a, 55b before the number of repetitions of the decoding process for each decoder exceeds a preset maximum number of repetitions (8 times in the figure), a decoding results combining unit 58 serially combines the decoding result for each of the code blocks c0 to c3 and inputs the result to an error detection unit 59. The error detection unit 59 uses CRC code in the serially combined decoding results to perform an error detection process, and when no errors are detected in the error detection process, outputs the combined decoding results. In the case of turbo decoding, a decoding process performed by an element decoder is counted as the decoding process for one time, and that number of times is taken to be the number of times the decoding process has been performed.

Conventionally, the maximum number of repetitions per code block was specified, and the decoding process was performed by the same number of decoders as number of code blocks. According to the present invention, whether or not a condition for stopping decoding has been met is judged after each decoding process by each decoder, and by specifying the maximum number of repetitions per decoder it is possible for one decoder to perform decoding processing for one or more code blocks. This makes it possible to reduce the number of decoders mounted, and to increase the number of times decoding is repeated per decoder for the input data, so it is possible to maintain or improve the error characteristics.

An embodiment in which one frame is divided into four code blocks and two decoders are provided is explained, however, the invention can generally be constructed so that one frame is divided into m number of code blocks, and r number of decoders are provided (m>r).

Moreover, in the first thru sixth embodiments of the invention described below, a transmission device divides a frame into code blocks, performs turbo encoding and transmits the result as shown in FIG. 27.

Furthermore, in the embodiments described below, the case of turbo encoding method is explained, however, any encoding method that error rate can be decreased by repeating the decoding process is possible. As an example of that kind of encoding method is LDPC encoding method (Low-Density Parity-Check encoding method). It is also not always necessary to use CRC as the error detection method. When CRC are not attached, determination of error by a decoder can be performed by a parity check.

(B) First Embodiment

Figure 3:
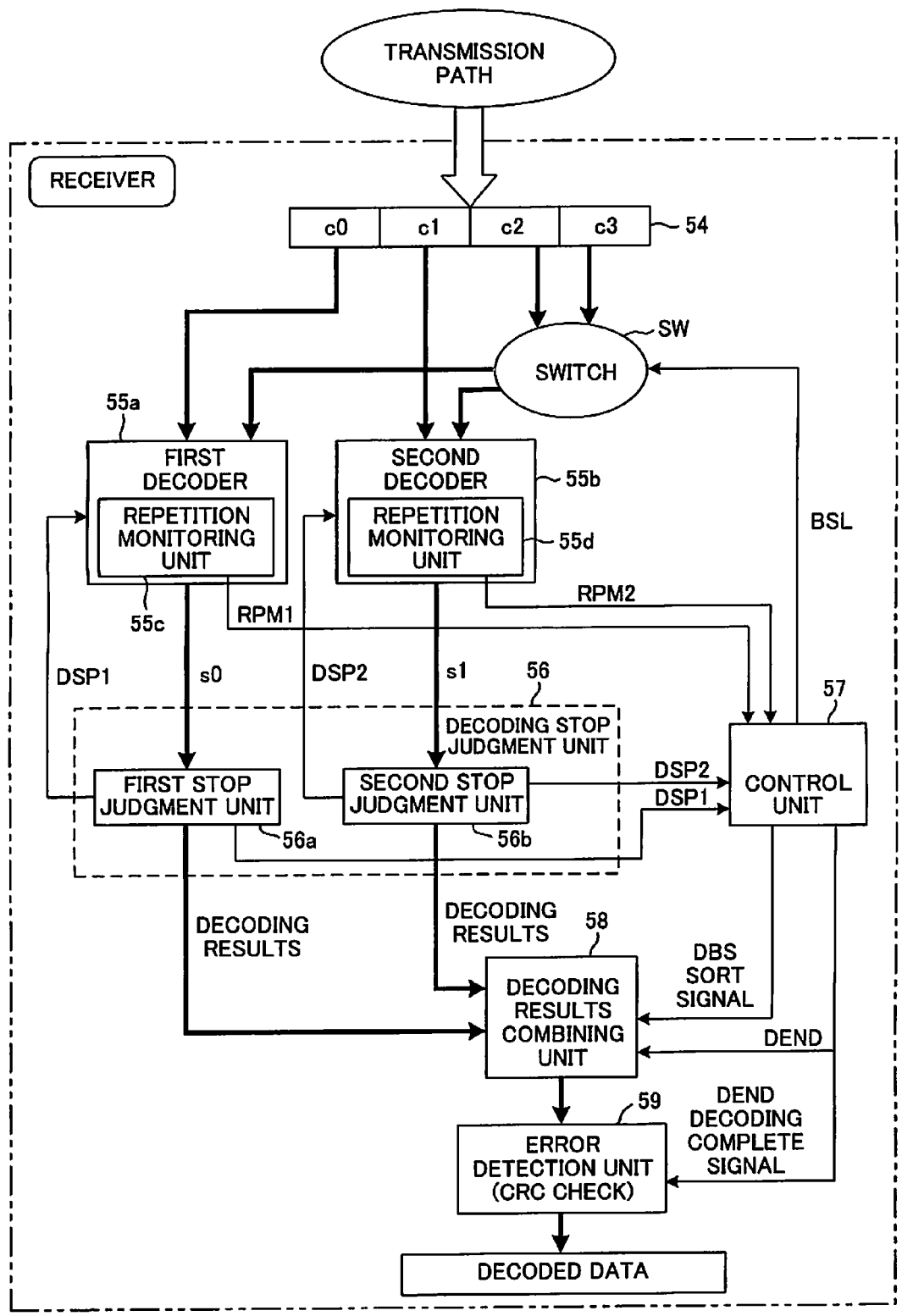
FIG. 3 is a block diagram of the main parts of a receiving device of a first embodiment of the present invention.

FIG. 3 is a block diagram of the main parts of a receiving device of a first embodiment of the present invention, where the same reference numbers are used for parts that are the same as those shown in FIG. 1. The same is true for all of the embodiments, but in the first embodiment shown in FIG. 3, the receiving unit, demodulation unit and separation unit are omitted from the figure, however the construction is the same as that shown in FIG. 1

After likelihood data for code blocks c0 to c3 has been saved in a buffer 54, first and second decoders 55a, 55b fetch the likelihood data of two code blocks c0, c1 in order from the start, and simultaneously execute the decoding process. The maximum number of repetitions of the decoding process by the first and second decoders 55a, 55b is specified, for example 8 times respectively and internal repetition monitoring units 55c, 55d monitor whether the number of repetitions has reached 8, and input the monitoring results RPM1, RPM2 to a control unit 57.

Figure 4:
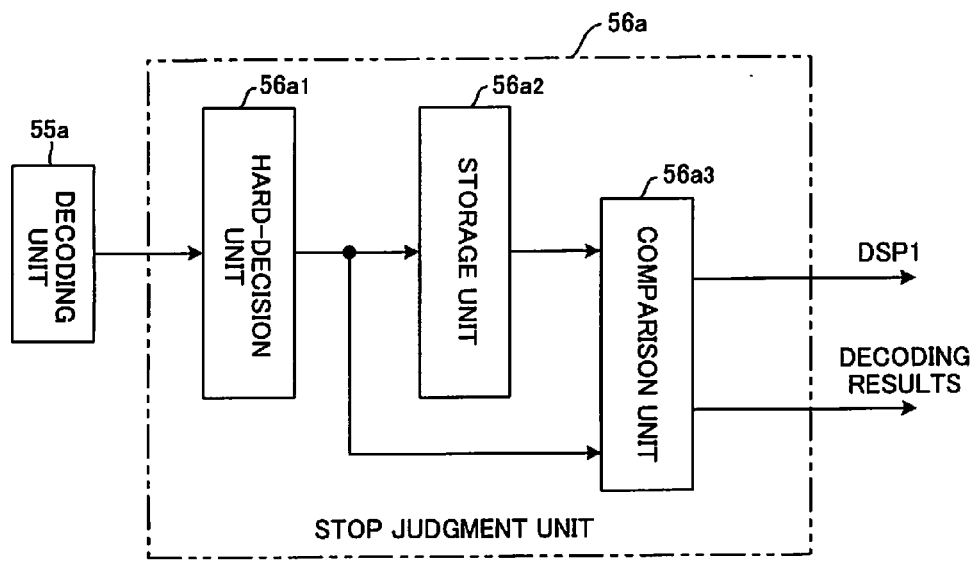
FIG. 4 is a schematic diagram of a stop judgment unit.

First and second stop judgment units 56a, 56b of the decoding stop judgment unit 56 determine whether a condition for stopping the decoding process has been met after each decoding process by the first and second decoders 55a, 55b. FIG. 4 is a schematic diagram of the first stop judgment unit 56a, where the second stop judgment unit 56b has the same construction. A hard-decision unit 56a1 makes a hard decision of the posteriori probability likelihood of all of the information bits of one code block that is input from the decoder 56a after each decoding process, and saves the hard-decision result for all of the information bits in a storage unit 56a2. A comparison unit 56a3 compares the current decoding process results with the previous decoding results, and when all of the bits match, determines the results to be error free (condition for stopping decoding is met) and outputs a decoding stop signal DSP1, as well as inputs the decoding results to a decoding results combining unit 58. Here, depending on the encoding format, construction is also possible where the decoding stop signal DSP1 is output when the decoding results match two times in succession.

After the conditions for stopping decoding are met and the decoding-stop signals DSP1, DSP2 have been input, the first and second decoders 55a, 55b stop until likelihood data for the next control blocks is input.

Figure 5:
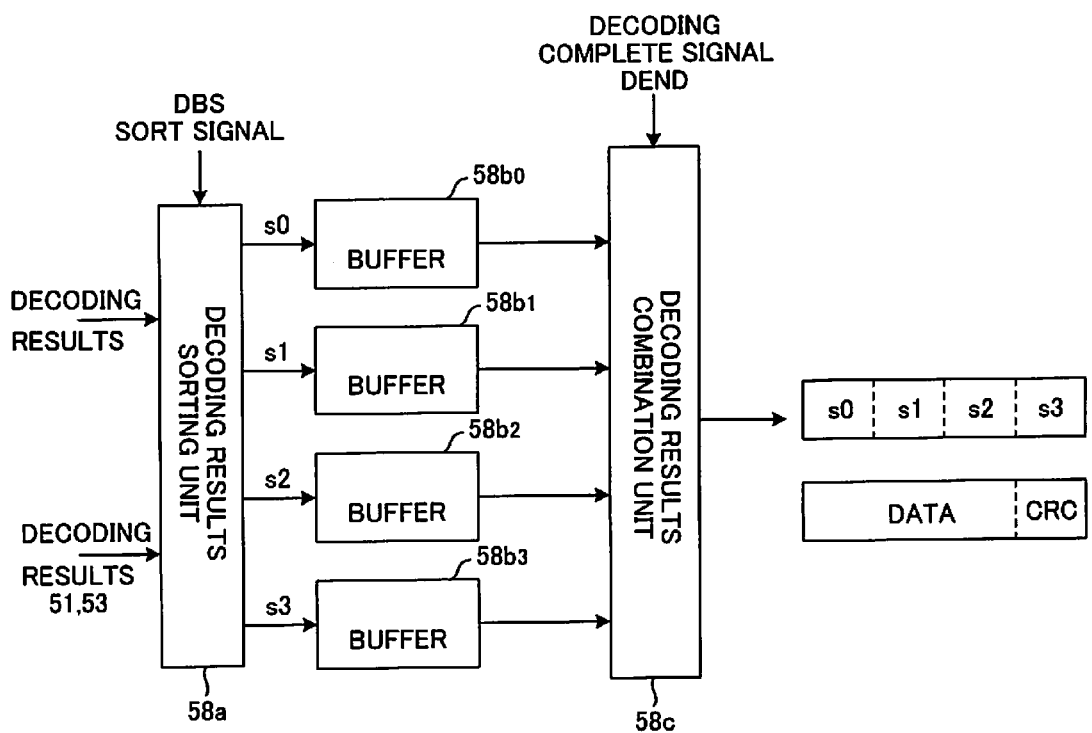
FIG. 5 is a schematic diagram of a decoding result combining unit.

Moreover, based on a sorting signal DBS that is sent from the control unit 57, the decoding result combining unit 58 saves the decoding results s0-s3 that are input from the first and second stop judgment units 56a, 56b when the conditions for stopping decoding are met. FIG. 5 is a schematic diagram of the decoding results combining unit 58, where a decoding results sorting unit 58a sequentially inputs the decoding results s0 to s3 of the code blocks c0 to c3 to specified buffers 58b0 to 58b3 based on the sorting signal DBS that is input from the control unit 57. When a decoding complete signal DEND is generated for all of the code blocks, a decoding results combining unit 58c serially combines the decoding results s0 to s3 of the code blocks in order, and inputs the result to an error detection unit 59.

When the decoding stop signal DSP1 or DSP2 is input, the control unit 57 controls the switch SW by a code block selection signal BSL in order to input a different code block for which the decoding process has not yet been performed to the first decoder 55a or second decoder 55b. For example, when a decoding stop signal DSP1 is generated from the first stop judgment unit 56a for the decoding results s0 of code block c0 that are output from the first decoder 55a, the control unit 57 controls the switch SW and assigns the decoding process of code block c2 for which the decoding process has not yet been performed to the first decoder 55a. In this case, when a decoding stop signal DSP2 is generated from the second stop judgment unit 56b earlier than that from the first stop judgment unit 56a, the control unit 57 controls the switch SW and assigns the decoding process of code block c2 for which the decoding process has not yet been performed to the second decoder 55b.

Next, when a decoding stop signal DSP2 is generated from the second stop judgment unit 56b for the decoding results s1 of code block c1 that are output from the second decoder 55b, the control unit 57 controls the switch SW and assigns the decoding process of the last code block c3 for which the decoding process has not yet been performed to the second decoder 55b.

In addition, the control unit 57 inputs a sorting signal DBS to the decoding results combining unit 58 so that the decoding results s0 to s3 of code block c0 to c3 are stored in the respective buffers $58b_0$ to $58b_3$.

In the decoding process described above, when the conditions for stopping decoding are met for all of the code blocks c0 to c3 before the number of times the decoding processes performed by the first and second decoders exceeds the preset maximum number of repetitions (8 times), the control unit 57 inputs a decoding complete signal DEND to the decoding results combining unit 58 and error detection unit 59. After receiving this decoding complete signal DEND, the decoding results combining unit 58 serially combines the decoding results of each of the code blocks, and the error detection unit 59 uses CRC code in the combined decoding results to perform the error detection process, and when no errors are found in the error detection process, outputs those decoding results, however, when errors are detected, determines that there was an error in decoding.

On the other hand, when the conditions for stopping decoding are not met for all of the code block c0 to c3 even though the number of times that the decoding processes by the first and second decoders exceeds the preset maximum number of repetitions, the control unit 57 determines that there was an error in decoding.

According to this first embodiment, it is possible to perform the decoding process for plural code blocks by one decoder, so by reducing the number of decoders that are mounted, and by increasing the number of times decoding is performed per decoder for input data, it is possible to maintain or improve the error characteristics.

(C) Second Embodiment

Figure 6:
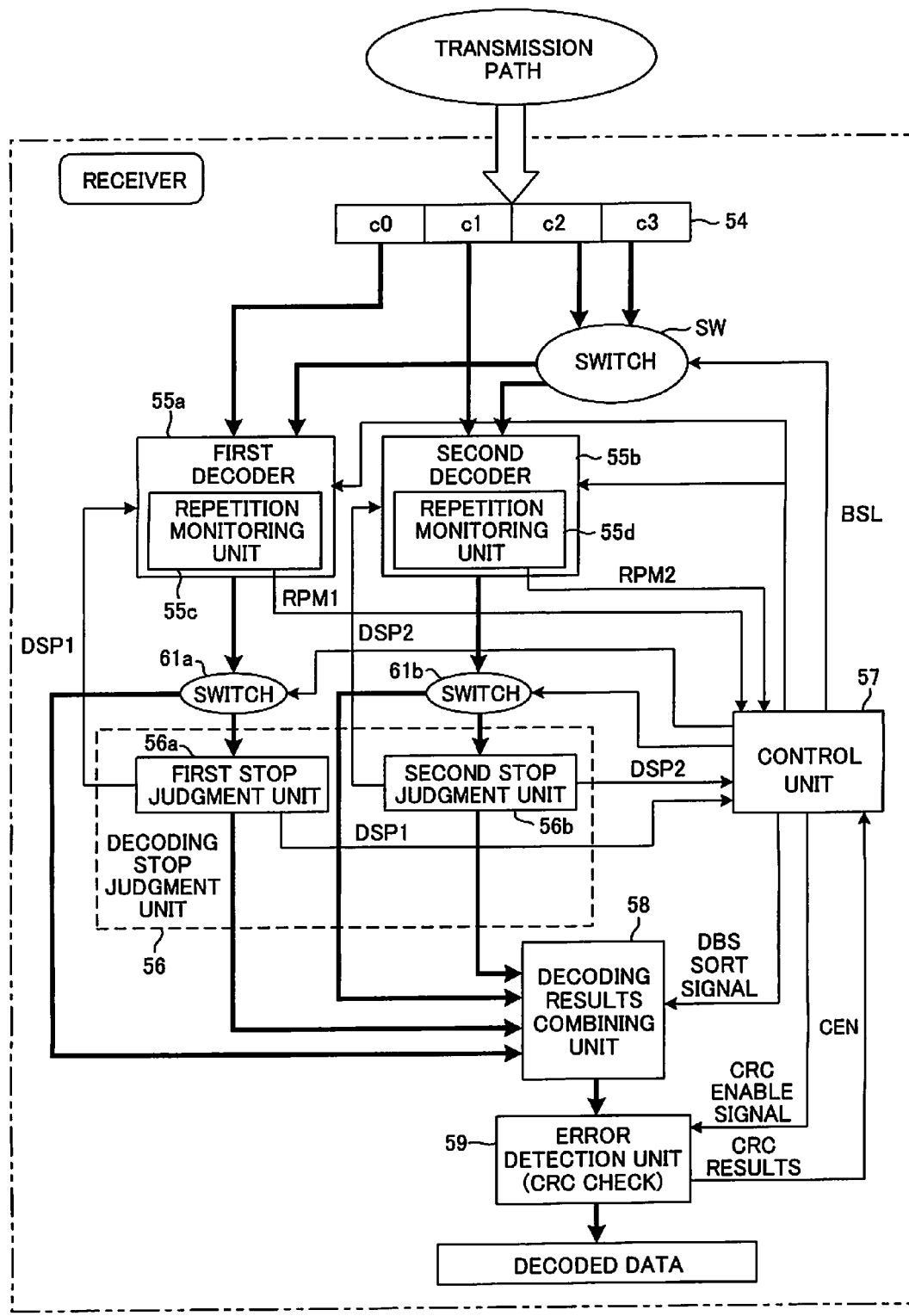
FIG. 6 is a schematic diagram of the main parts of a receiving device of a second embodiment.

FIG. 6 is a schematic diagram of the main parts of a receiving device of a second embodiment of the invention, where the same reference numbers are used for parts that are the same as those of the receiving device of the first embodiment shown in FIG. 3. The construction of this embodiment differs in that two switches, first and second switches 61a, 61b, are provided for selectively inputting the decoding results of the first and second decoders 55a, 55b to the decoding stop judgment unit 56 and decoding results combining unit 58.

When the conditions for stopping decoding have been met for all of the code blocks except for one remaining code block, the control unit 57 controls the switches 61a, 61b and inputs the decoding results of the last code block to the decoding results combining unit 58. After the decoding process for the final block, the decoding results combining unit 58 serially combines the decoding result of the final block with the decoding results of the other blocks and inputs the combined result to the error detection unit 59, and the error detection unit 59 uses CRC code in the combined decoding results to perform the error detection process, and when there are no errors found in that error detection process, outputs the serially combined decoding results.

Figure 7:
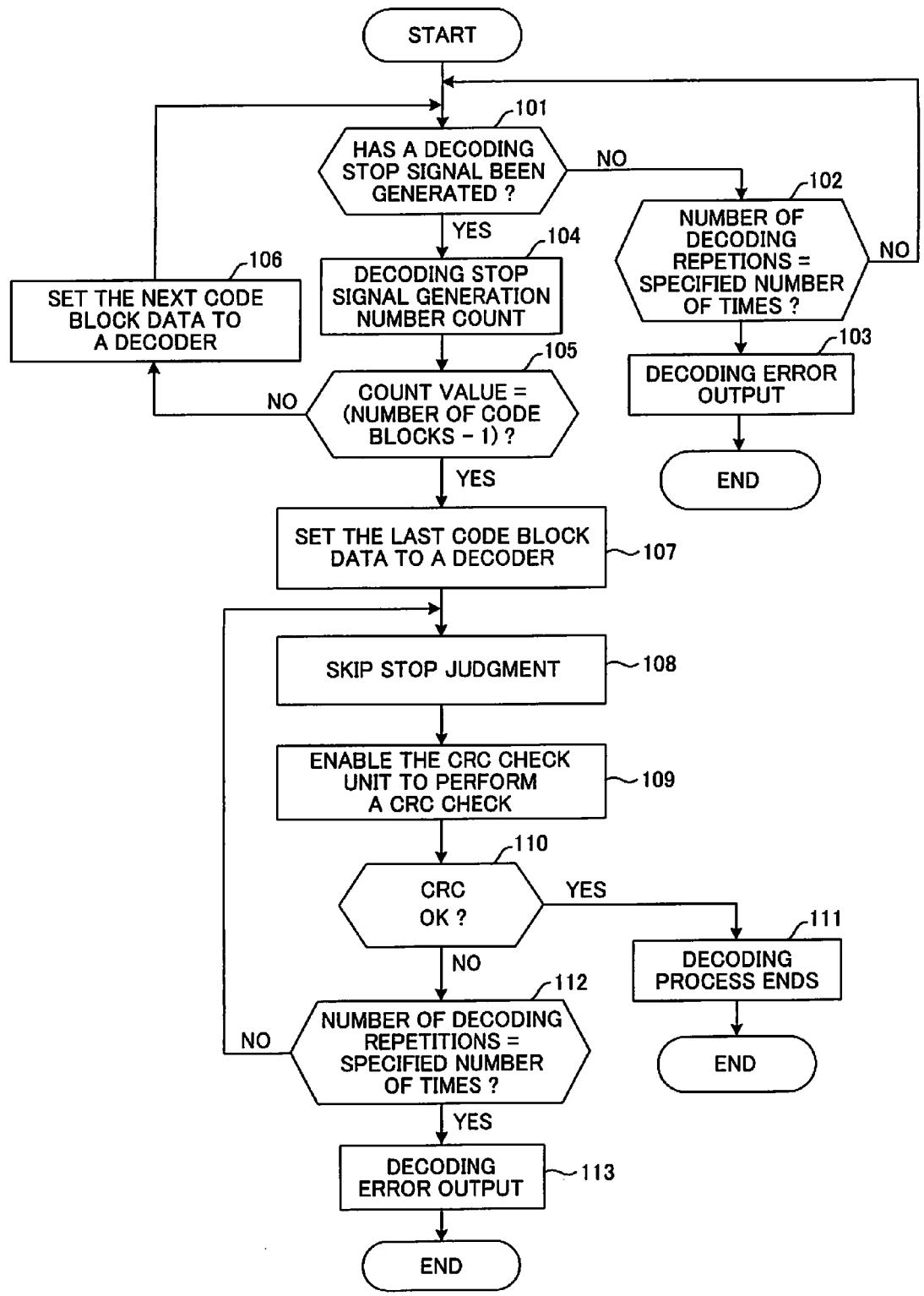
FIG. 7 is a flowchart showing the processing by a control unit in a second embodiment.

FIG. 7 is a flowchart of the processing by the control unit 57 in this second embodiment.

The control unit 57 monitors whether the decoding stop signals DSP1, DSP2 are generated (step 101), and when the signals are not generated, makes reference to the monitoring results RPM1, RPM2 to check whether the number of times decoding has been performed by the first and second decoders 55a, 55b has reached the maximum number of repetitions (step 102), when the number of times decoding has been performed has not reached the maximum number, the control unit 57 returns to step 101 and waits for the decoding stop signals DSP1, DSP2 to be generated. However, when the number of times decoding has been performed by the first and second decoders 55a, 55b has reached the maximum number of repetitions, outputs a decoding error (step S103).

In step 101, when one of the decoding stop signals DSP1, DSP2 is generated, the control unit 57 counts the number of times that the decoding stop signal is generated (step 104), and checks whether the count value reaches a value (B−1) obtained by subtracting 1 from the number of code blocks B per frame (step 105). In other words, checks whether the conditions for stopping decoding have been met of all of the code blocks except for one remaining code block.

When the count value is less than (B−1), the control unit 57 sets the likelihood data of the next code block to the decoder that corresponds to the decoding stop signal (step 106), then repeats the process from step 101.

In step 105 when the count value is equal to (B−1), the control unit 57 inputs the likelihood data of the last code block to the decoder that corresponds to the decoding stop signal (step 107). Moreover, the control unit 57 controls the switches 61a, 61b after the decoding process of the last code block, and without inputting the decoding results to the decoding stop judgment unit 56, inputs the decoding result to the decoding results combining unit 58. In this way, the control unit 57 skips the stop judgment by the decoding stop judgment unit 56 (step 108). The decoding results combining unit 58 serially combines the decoding result of the last block with the decoding results of the other code blocks, and inputs that result to the error detection unit 59. Furthermore, the control unit 57 inputs a CRC check enable signal CEN to the error detection unit 59 (step 109). After receiving this enable signal, the error detection unit 59 uses the CRC in the serially combined decoding results that were output from the decoding results combining unit 58 to perform the error detection process. The control unit 57 checks whether or not an error was detected in the CRC check (step 110), and when no error is detected, ends the decoding processing by the decoders (step 111).

In step 110, when an error is detected, the control unit 57 checks whether the number of times decoding has been performed by the first and second decoders 55a, 55b has reached the maximum number of repetitions (step 112), and when that number has not reached the maximum number, repeats the processing from step 108, and when the number of times decoding has been performed by the first and second decoders 55a, 55b reaches the maximum number of repetitions before the CRC check becomes OK, outputs a decoding error (step 113).

According to this second embodiment, the decoding stop judgment is skipped for the last code block, and CRC code is used to perform the error detection process, so when the detection accuracy of the CRC check is high, it becomes possible to perform judgment with higher accuracy. Moreover, since it is possible to omit performing the decoding stop judgment process one time, it is possible to shorten the processing time.

(D) Third Embodiment

Figure 8:
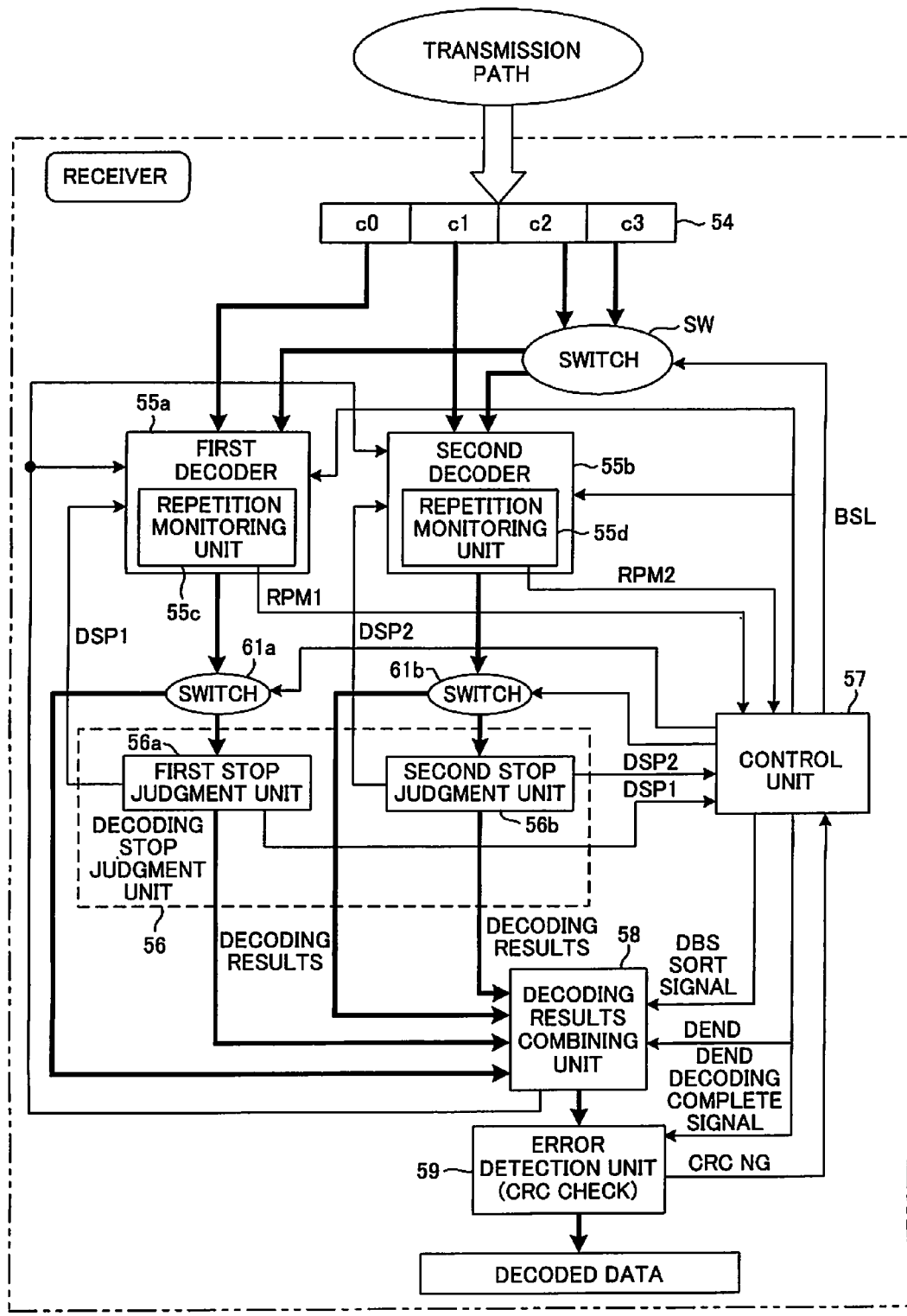
FIG. 8 is a schematic diagram of the main parts of a receiving device of a third embodiment.

FIG. 8 is a schematic diagram of the main parts of a receiving device of a third embodiment of the invention, where the same reference numbers are used for parts that are the same as those of the receiving device of the first embodiment shown in FIG. 3. The construction of this embodiment differs in that two switches, first and second switches 61a, 61b, are provided that selectively input the decoding results from the first and second decoders 55a, 55b to the decoding stop judgment unit 56 and decoding results combining unit 58.

Figure 9:
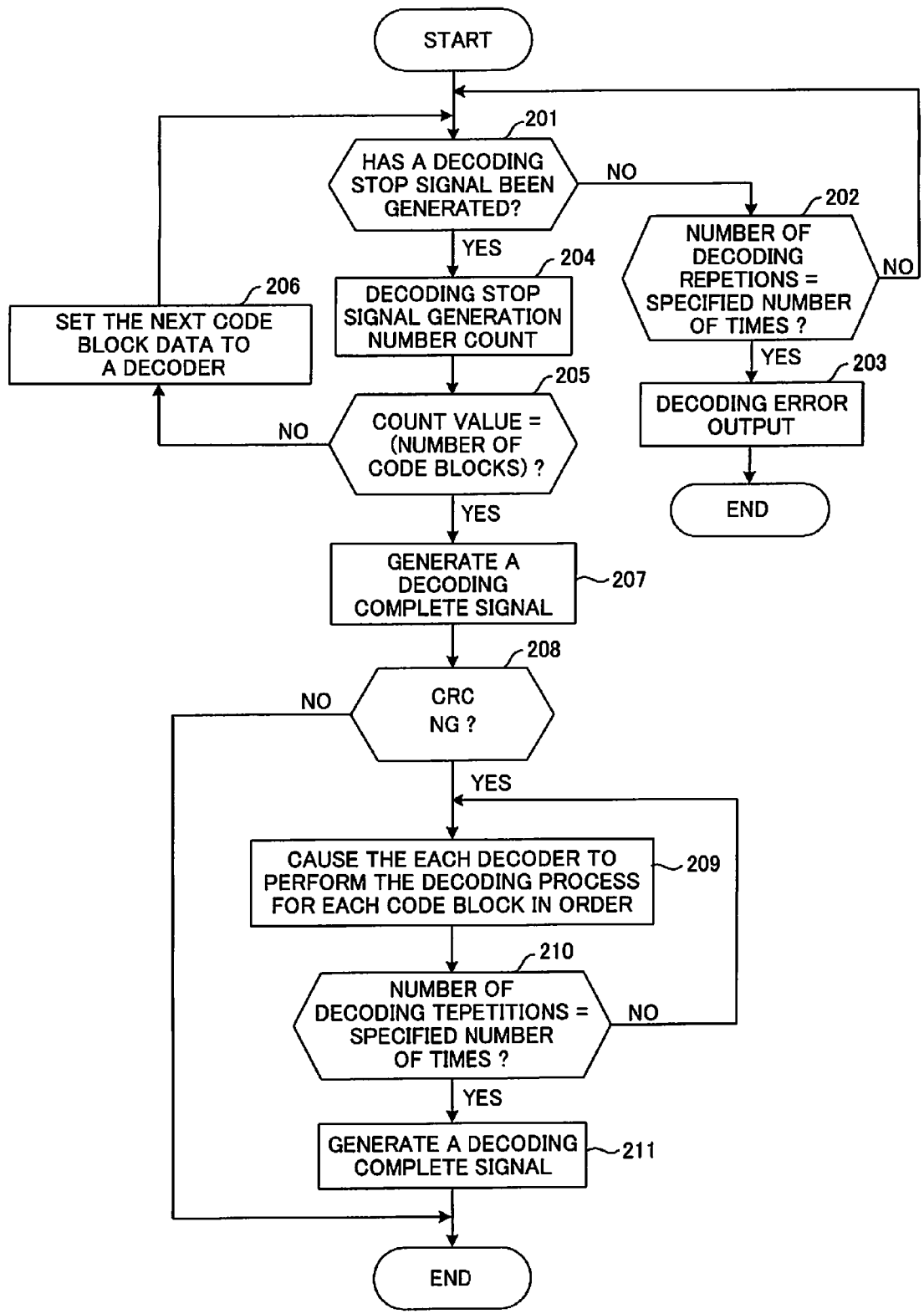
FIG. 9 is a flowchart showing the processing by a control unit in a third embodiment.

FIG. 9 is a flowchart of the processing by a control unit 57 of this third embodiment.

The control unit 57 monitors whether decoding stop signals DSP1, DSP2 have been generated (step 201), and when they are not generated, makes reference to the monitoring results RPM1, RPM2 to check whether the number of times decoding has been performed by the first and second decoders 55a, 55b has reached the maximum number of repetitions (step 202), and when the number of times has not reached the maximum number, returns to step 201 and waits for the decoding stop signals DSP1, DSP2 to be generated. However, when the number of times that decoding has been performed by the first and second decoders 55a, 55b has reached the maximum number of repetitions, the control unit 57 outputs a decoding error (step 203).

In step 201, when only one of the decoding stop signals DSP1, DSP2 has been generated, the control unit 57 counts the number of times that the decoding stop signal has been generated (step 204), and checks whether the count value has reached the number of code blocks B per frame (step 205). In other words, the control unit 57 checks whether conditions for stopping decoding have been met for all code blocks.

When the count value is less than B, the control unit 57 inputs likelihood data of the next code block to the decoder that corresponds to the decoding stop signal (step 206), then repeats processing from step 201.

In step 205, when the count value=B, the control unit 57 outputs a decoding complete signal DEND (step 207). That is, when the conditions for stopping decoding have been met for all code block c0 to c3 before the number of times the decoding process has been repeated by the first and second decoders 55a, 55b has reached a preset maximum number of repetitions (8 times), the control unit 57 inputs a decoding complete signal DEND to a decoding results combining unit 58 and error detection unit 59.

After receiving this decoding complete signal, the decoding results combining unit 58 serially combines the decoding results of all of the code blocks, and the error detection unit 59 uses CRC code in the combined decoding results to perform an error detection process, and when no errors are found in the error detection process, outputs the combined decoding results. On the other hand, when an error is detected, the control unit 57 determines there is a decoding error (step 208) and causes the decoders 55a, 55b to execute in order the decoding process for each of the code blocks c0 to c3 until the number of times the decoding process has been repeated reaches the preset maximum number of repetitions (step 209). The first and second decoders 55a, 55b use the decoding results that are saved in buffers $58b_0$ to $58b_3$ of the decoding results combining unit 58 and the likelihood data that is saved in a buffer 54 to execute in order the decoding process for each of the code blocks c0 to c3, and the control unit 57 stores in order the decoding results in the buffers $58b_0$ to $58b_3$ of the decoding results combining unit 58 via switches 61a, 61b.

The control unit 57 checks whether the number of times the decoding process has been repeated has reached the preset maximum number of repetitions (step 210), and continues the process of step 209 until the number has reached the maximum number, then when the number reaches the maximum number, generates a decoding complete signal DEND again (step 211). After receiving this decoding complete signal DEND, the decoding results combining unit 58 serially combines the decoding results of each code block, and the error detection unit 59 uses CRC code in the combined decoding results to perform the error detection process, and when there is no error, outputs the decoding results, however, when an error is detected, outputs a decoding error.

According to this third embodiment, when an error is detected by CRC error detection, the decoding process for each code block is continued until the number of repetitions reaches the maximum number of repetitions, so it is possible to reduce the number of times a decoding error is detected.

(E) Fourth Embodiment

FIG. 10 is a drawing for explaining the theory of a fourth embodiment of the invention. In the first embodiment, the case of assigning the decoding process of code blocks c0 to c3 to two decoders 55a, 55b in the order c0→c1→c2→c3 was explained. However, as shown in (A) of FIG. 10, in this assignment method, two code blocks c1, c3 for which it is difficult to meet the conditions for stopping decoding are assigned to the same second decoder 55b. Therefore, it becomes difficult to meet the conditions for stopping decoding for all of the code blocks even though the decoding process is performed the specified maximum number of repetitions. Generally, the higher the reliability of the likelihood data of a code block is, the conditions for stopping the decoding process are met by performing the decoding process a fewer number of times. Therefore, as shown in (B) of FIG. 10, by assigning a code block having likelihood data with high reliability and a code block having likelihood data with low reliability to one decoder, the conditions for stopping the decoding process for all of the code blocks will be met before the number of times the decoding process has been performed reaches the specified maximum number of repetitions. In (B) of FIG. 10, an example is shown in which code block c0 having high reliability and code block c3 having low reliability are assigned to the first decoder 55a, and code block c2 having high reliability and code block c1 having low reliability are assigned to the second decoder 55b, and the conditions for stopping the decoding process is met for all code blocks after the number of times the decoding process was performed 7 times.

Figure 11:
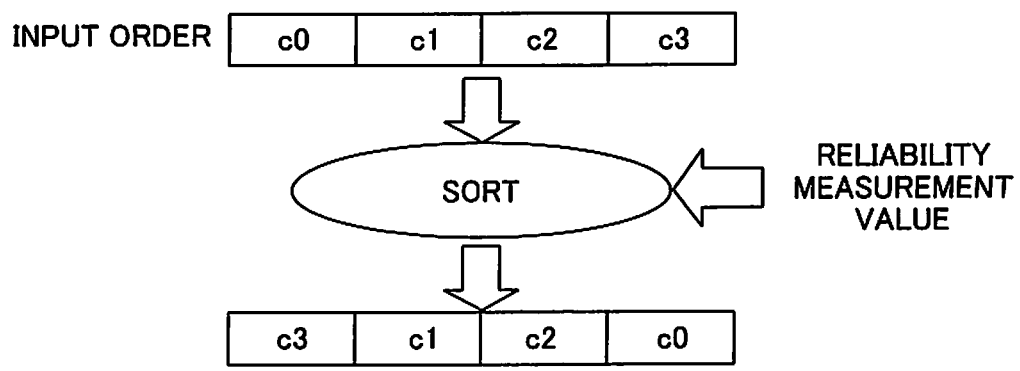
FIG. 11 is a drawing for explaining the measurement of reliability of each code block, and sorting the code blocks in order of poor reliability.

Therefore, as shown in FIG. 11, in the fourth embodiment, the reliability of each of the code blocks c0 to c3 is measured, and the code blocks are assigned to the first and second decoders 55a, 55b in the order of poor reliability c3→c1→c2→c0. As shown in (B) of FIG. 10, by doing this, first, control blocks c3 and c1 are assigned to the first decoder 55a and second decoder 55b, respectively, then each time a condition for stopping a decoding process is met, the code blocks are assigned in the order c2→c0 to the second decoder 55b and first decoder 55a.

Figure 12:
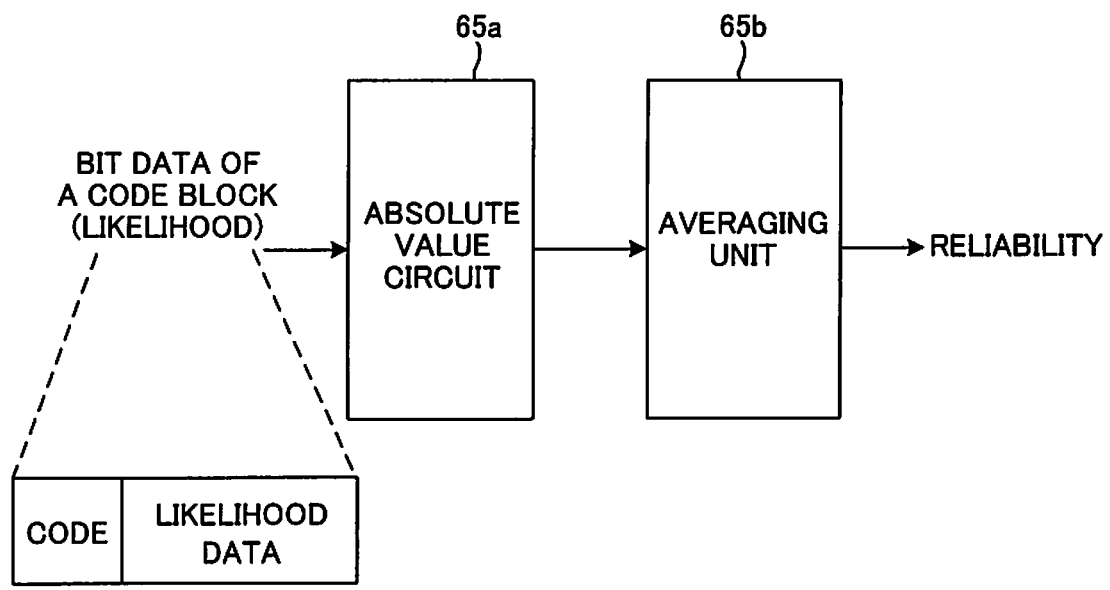
FIG. 12 shows a structure example of the reliability measurement of a code block.

FIG. 12 shows an example of the reliability measurement of a code block, where an absolute value circuit 65a calculates the absolute value of likelihood data (code and reliability) of encoded information bits of a code block, and an averaging unit 65b calculates the average value of the all of the absolute values of likelihood data and outputs the average value as the reliability. Instead of the average value of the absolute values of the likelihood, it is possible to use the average SNR value of the likelihood data, or the minimum value of the absolute values of the likelihood as the reliability.

Figure 13:
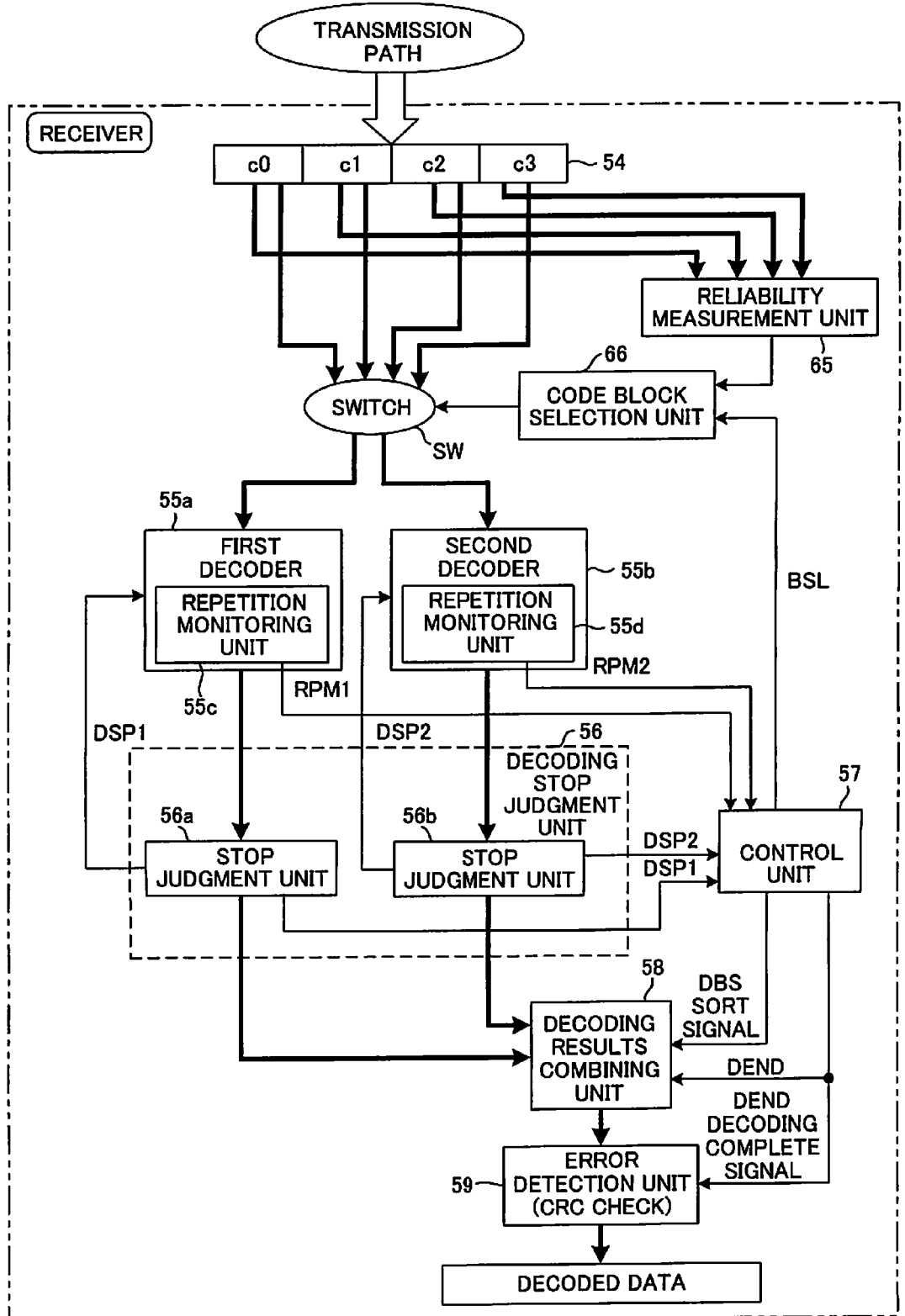
FIG. 13 is a schematic diagram of the main parts of a receiving device of a fourth embodiment.

FIG. 13 is a schematic diagram of the main parts of a receiving device of this fourth embodiment, where the same reference numbers are given to parts that are the same as those of the receiving device of the first embodiment shown in FIG. 3. This embodiment differs in that: (1) a reliability measurement unit 65 is provided as shown in FIG. 12, and (2) a code block selection unit 66 is provided. The code block selection unit 66 controls the switch SW according to an instruction from the control unit 57 at the start of the decoding process and when conditions are met for stopping decoding, and assigns code blocks in order of poor reliability to the first and second decoders 55a, 55b.

According to this fourth embodiment, it becomes easier to meet the conditions for stopping decoding for all of the code blocks before the number of times decoding is performed reaches the specified maximum number of repetitions, so it is possible to reduce decoding error.

(F) Fifth Embodiment

Figure 14:
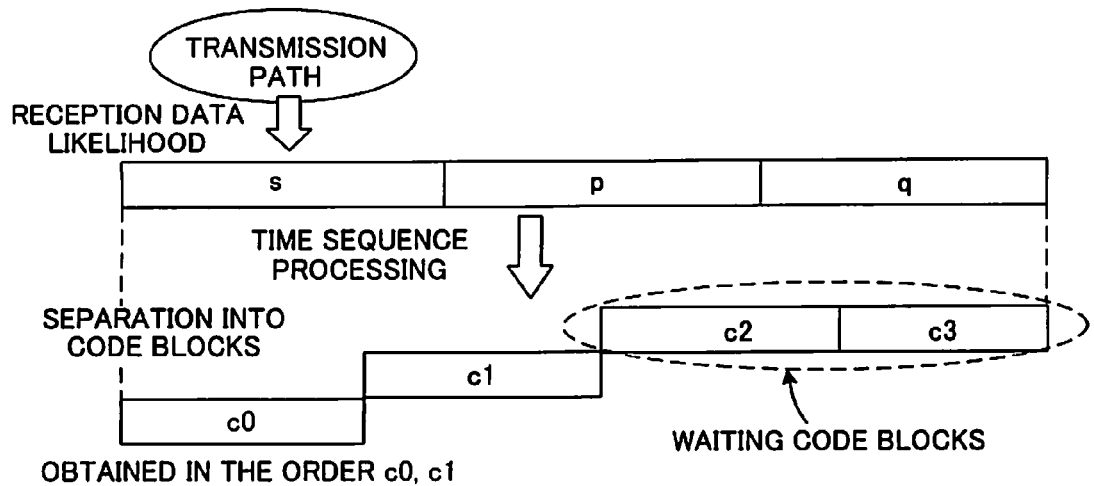
FIG. 14 is a drawing for explaining the theory of a fifth embodiment.
Figure 15:
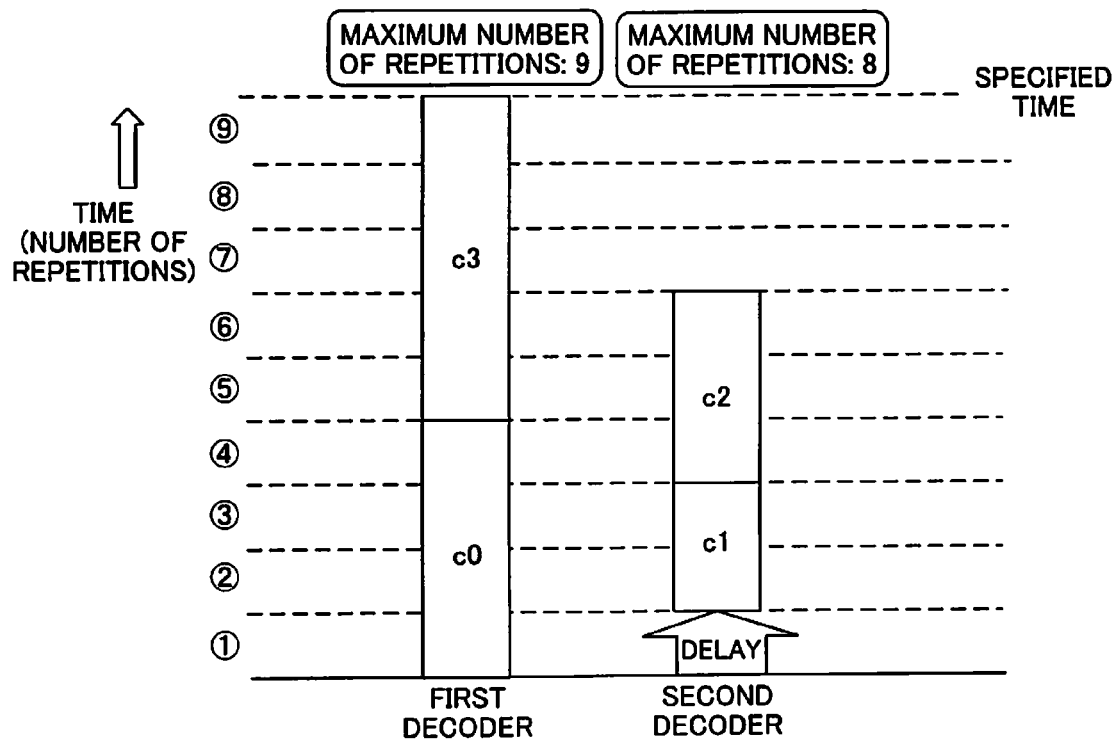
FIG. 15 is a drawing for explaining the theory of a fifth embodiment.

FIG. 14 and FIG. 15 are drawings for explaining the theory of a fifth embodiment of the invention.

As shown in FIG. 14, the received likelihood data that is output from the demodulation unit of the receiving device has construction in which the systematic bits s, first parity bits p and second parity bits q are linked in succession for four code blocks.

A code block separation unit separates the systematic bits s, first parity bits p, second parity bits q into systematic bits si (i=0 to 3) for each code block, first parity bits pi (i=0 to 3) for each code block, and second parity bits qi (i=0 to 3) for each code block, then performs a process of assembling the code blocks in a time sequence in the order c0 (s0, p0, q0)→c1 (s1, p1, q1)→c2 (s2, p2, q2)→c3 (s3, p3, q3), and saves the result in a buffer 54. The result of this time sequence processing makes it possible to perform the decoding process in order from code block c0, and delays the start of decoding of the next code block c1. The time sequence processing is necessary processing in order to reduce the scale of the circuit.

In this fifth embodiment, assuming that it is possible to perform the decoding process one time during the delay time, with the timing shown in FIG. 15, the first decoder 55a performs the second decoding process and the second decoder 55b performs the first decoding process, and after that the first decoder 55a performs the nth decoding process and the second decoder 55b performs the (n−1)th decoding process. In addition, the maximum number of repetitions by the first decoder 55a that starts the decoding process first is greater than the maximum number of repetitions by the second decoder 55b. In the example shown in FIG. 15, the maximum number of repetitions by the first decoder 55a is 9 times, and the maximum number of repetitions by the second decoder 55b is 8 times.

Figure 16:
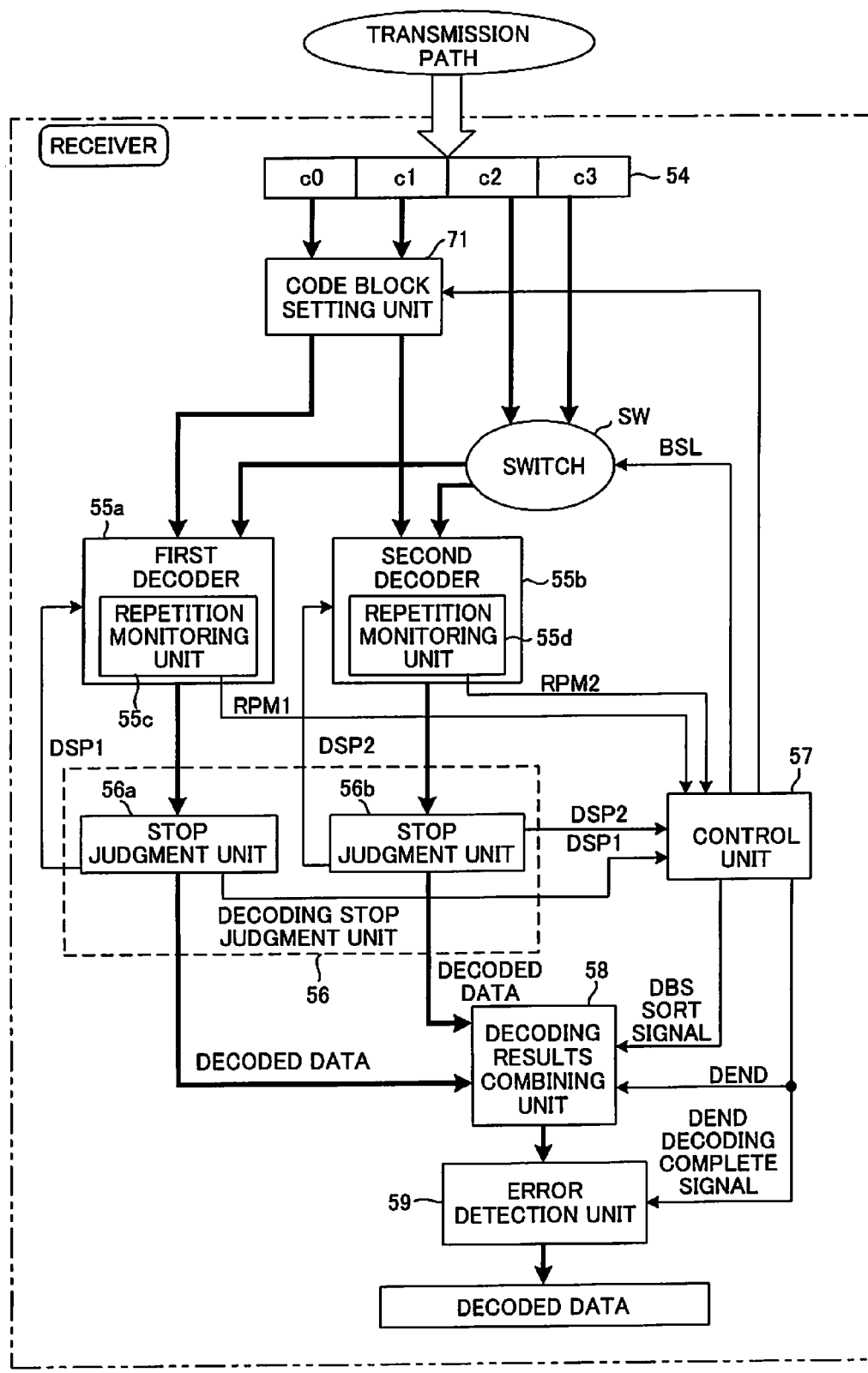
FIG. 16 is a schematic diagram of the main parts of a receiving device of a fifth embodiment.

FIG. 16 is a schematic diagram of the main parts of a receiving device of this fifth embodiment, where the same reference numbers are used for parts that are the same as those of the receiving device of the first embodiment shown in FIG. 3. This embodiment differs in that a code block setting unit 71 has been provided. At the start of the decoding process, when it becomes possible to perform the decoding process for the first code block c0, the code block setting unit 71 sets likelihood data for code block c0 to the first decoder 55a, and when it becomes possible to perform the decoding process for the next code block c1, sets the likelihood data for that code block c1 to the second decoder 55b, after which the control unit 57 control execution of the decoding processing by the first and second decoders 55a, 55b according to the timing shown in FIG. 15.

Figure 17:
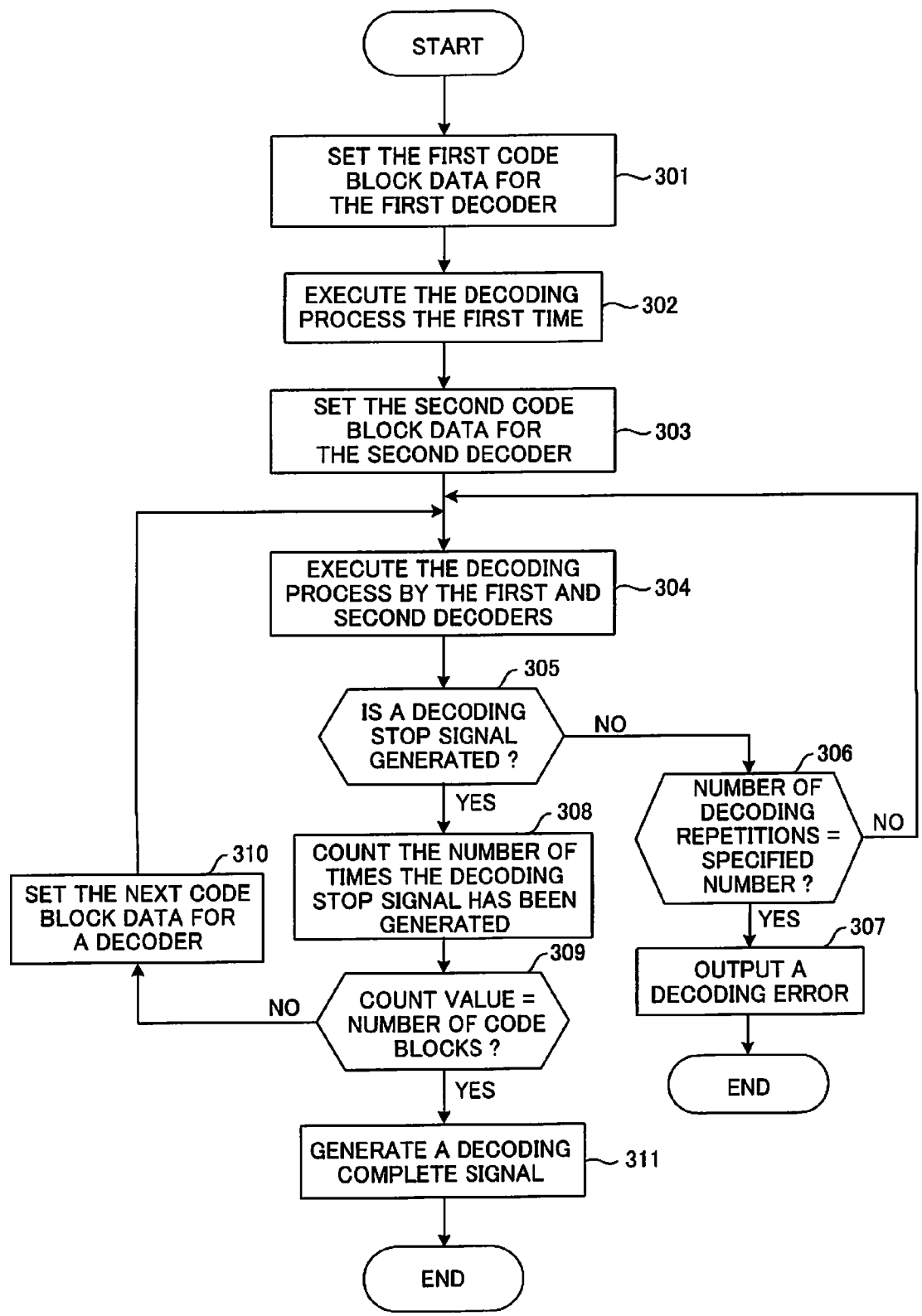
FIG. 17 is a flowchart of the processing by a control unit of a fifth embodiment.

FIG. 17 is a flowchart of the processing by the control unit 57 of this fifth embodiment. At the start of decoding processing, when decoding becomes possible for the first code block c0, the code block setting unit 71 sets the likelihood data of that code block c0 to the first decoder 55a according to an instruction from the control unit 57 (step 301). By doing this, the first decoder 55a starts the first decoding process (step 302). During this time, when decoding becomes possible for the next code block c1, the code block setting unit 71 sets the likelihood data for that code block c1 to the second decoder 55b according to an instruction from the control unit 57 (step 303). After the first decoder 55a finishes the first decoding process, the control unit 57 performs control so that after that, the first decoder 55a performs the nth decoding process and the second decoder 55b performs the (n−1)th decoding process at the same time (step 304).

Next, the control unit 57 monitors whether the decoding stop signals DSP1, DSP2 are generated (step 305), and when they are not generated, makes reference to the monitoring results RPM1, RPM2 to check whether the number of times decoding has been performed by the first and second decoders 55a, 55b has reached the maximum number of repetitions (step 306), and when the number has not yet reached the maximum number, returns to step 304 and waits for the decoding stop signals DSP1, DSP2 to be generated. However, when the number of times that decoding has been performed by the first and second decoders 55a, 55b has reached the maximum number of repetitions (here, 9 times and 8 times, respectively), outputs a decoding error (step 307).

In step 305, when on one of the decoding stop signals DSP1, DSP2 has been generated, the control unit 57 counts the number of times that the decoding stop signal has been generated (step 308), and checks whether the count value is equal to the number of code blocks B per frame (step 309). In other words, checks whether the conditions for stopping decoding have been met for all code blocks.

When the count value is less than B, the control unit 57 inputs the likelihood data of the next code block to the decoder that corresponds to the decoding stop signal (step 310), and repeats processing from step 304. In step 309, when the count value=B, the control unit 57 outputs a decoding complete signal DEND (step 311). In other words, when the conditions for stopping decoding of all of the code blocks c0 to c3 are met before the number of times decoding has been performed by the first and second decoders 55a, 55b exceeds the preset maximum number of repetitions (here, 9 times and 8 times, respectively), the control unit 57 inputs the decoding complete signal DEND to the decoding results combining unit 58 and error detection unit 59. After receiving this decoding complete signal DEND, the decoding results combining unit 58 serially combines the decoding results of all of the code blocks, and the error detection unit 59 uses the CRC code in the combined decoding results to perform the error detection process, and when no errors are detected in the error detection process, outputs the combined decoding results.

According to this fifth embodiment, the maximum number of repetitions can be increased the earlier a decoder starts the decoding process, so it is possible to reduce the number of times at which a decoding error is determined.

(G) Sixth Embodiment

Figure 18:
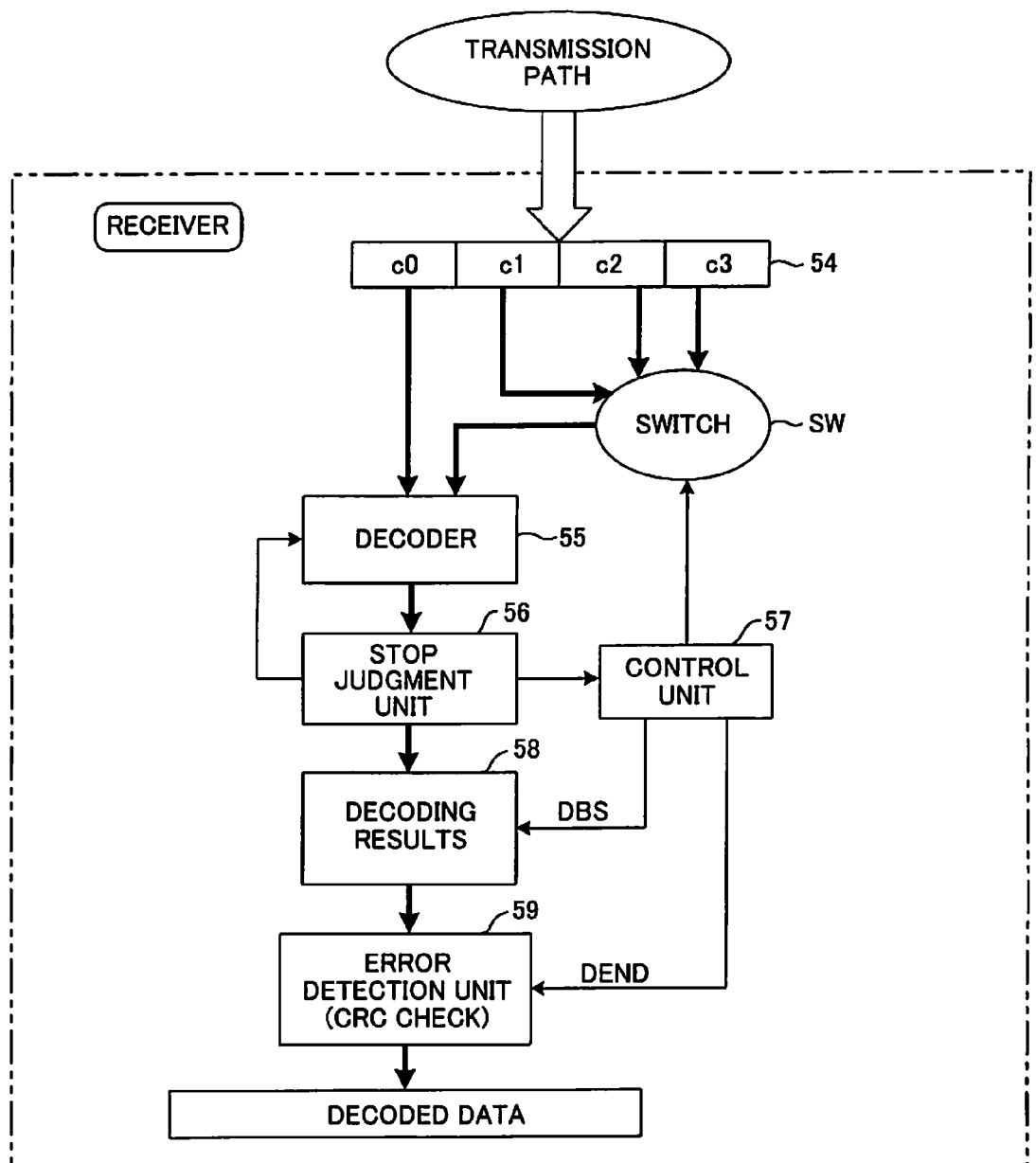
FIG. 18 is a schematic diagram of a receiving device of a sixth embodiment.

FIG. 18 is a schematic diagram of a receiving device of a sixth embodiment of the invention, and is an example in which one decoder is provided that is capable of high speed decoding, for example, a decoder having parallel MAP operation construction (refer to Japanese published patent application 2004-164040A). Since only one decoder 55 is provided, there only needs to be one stop judgment unit 56. The other construction is the same as that of the first embodiment shown in FIG. 3, and the same reference numbers are used.

Figure 19:
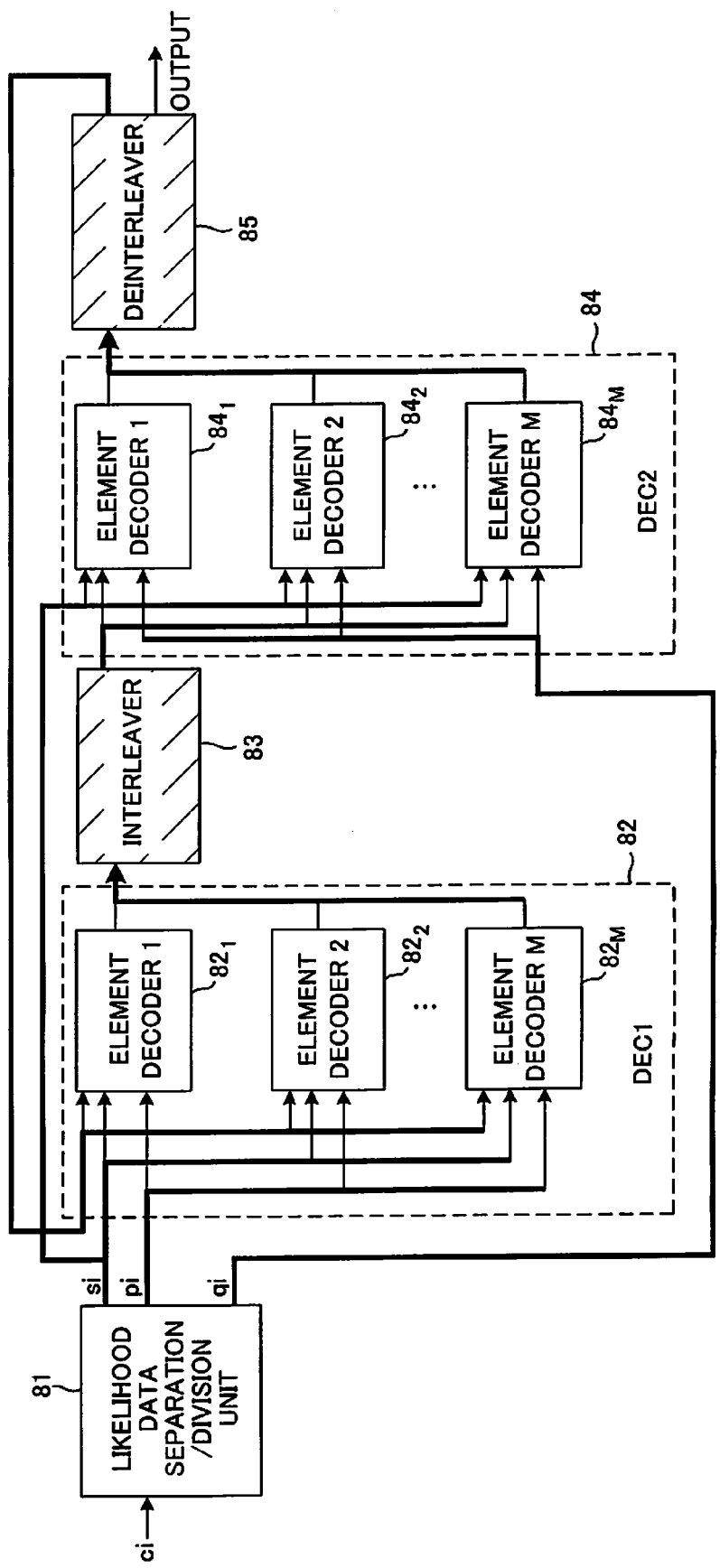
FIG. 19 shows an example of a decoder of a sixth embodiment.

FIG. 19 is an example of the decoder 55, however, for a detailed description of the construction, refer to Japanese published patent application 2004-164040A. This decoder 55 includes a likelihood data separation/division unit 81, a first element decoder (DEC1) 82, interleaver 83, second element decoder (DEC2) 84 and deinterleaver 85. The thick tines connecting each of the parts comprise M number of signal lines that make M number of parallel input and output possible. The first element decoder (DEC1) 82 and second element decoder (DEC2) 84 work in together, and are constructed such that they alternately perform the first half and tatter half of the MAP decoding process. Moreover, the interleaver 83 and deinterleaver 85 also work together and can be such that they suitably perform the interleaving and deinterleaving process.

The likelihood data separation/division unit 81 separates code blocks ci (i=0, 1, 2, 3) into systematic bits si, first parity bits pi and second parity bits qi, as well as divides them into M number each, respectively. The first element decoder 82 includes M number of element decoders 82$_1$ to 82$_M$ in parallel that employ the MAP decoding method, and similarly the second element decoder 84 includes M number of element decoders 84$_1$ to 84$_M$ in parallel that employ the MAP decoding method. The first element decoder 82 uses the M number of element decoders to execute the first half of the element decoding process in parallel, the interleaver 83 collects and interleaves the each of the element decoding results, the second element decoder 84 uses the M number of element decoders to execute the tatter half of the element decoding process in parallel, and the deinterleaver 85 collects and deinterleaves the each of the element decoding results. With the decoder shown in FIG. 19, likelihood data of a code block is divided into M number of divisions and the decoding operation is performed simultaneously in parallel for each division of information, so it is possible to increase the decoding speed by M times.

Figure 20:
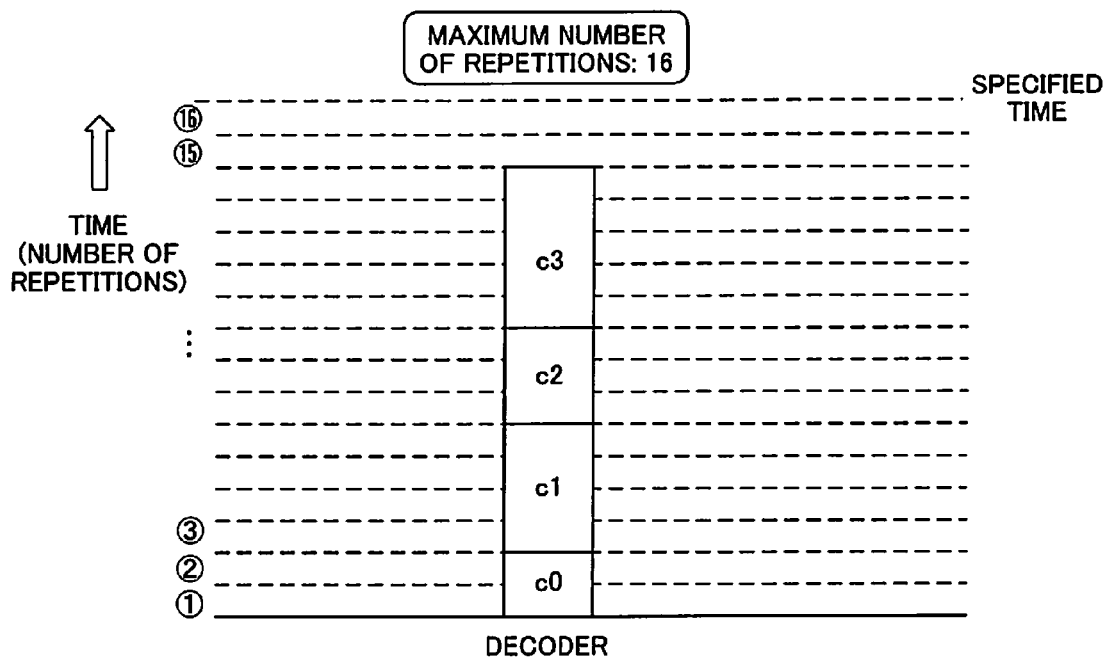
FIG. 20 is a drawing for explaining the decoding process of a sixth embodiment.

FIG. 20 is a drawing for explaining the decoding process of this sixth embodiment, where a high-speed decoder is used as the decoder 55, so presuming M=2, the maximum number of repetitions becomes 16 times. The decoding process is performed in order for control blocks c0, c1, c2 and c3, with the conditions for stopping decoding of alt of the control blocks being met before the maximum number of repetitions.

This sixth embodiment has advantages in that the decoding process is possible with just one decoder, construction and control are simple, and the size of the circuit can be made smaller.

Moreover, this sixth embodiment is also useful in that when compared with embodiments of using a plurality of decoders, it is possible to repeatedly perform the decoding process more efficiently. For example, in an embodiment where two decoders are used, when a first decoder finishes the decoding process for the code block assigned to it before a second decoder, that first decoder must wait without doing anything for the remainder of a specified time, so that time is wasted. However, when there is only one decoder as in this sixth embodiment, that time can be used for the decoding process of another code block, so it is possible to repeatedly perform the decoding process more efficiently.

(H) Seventh Embodiment

In the first thru sixth embodiments, the case was explained in which the transmitting device divided the code blocks as shown in FIG. 27, performed turbo encoding and transmitted the result, however, it is also possible for the transmission device to attach error detection code (CRC code) to all of the code blocks except for the last code block, as well as attach one error detection code (CRC code) to the entire code block, then perform turbo encoding and transmit the result. In this case, it is possible to determine whether or not the conditions for stopping decoding are met through CRC error detection without the stop judgment unit comprising the construction shown in FIG. 4 determining whether or not the conditions for stopping decoding have been met.

Figure 21:
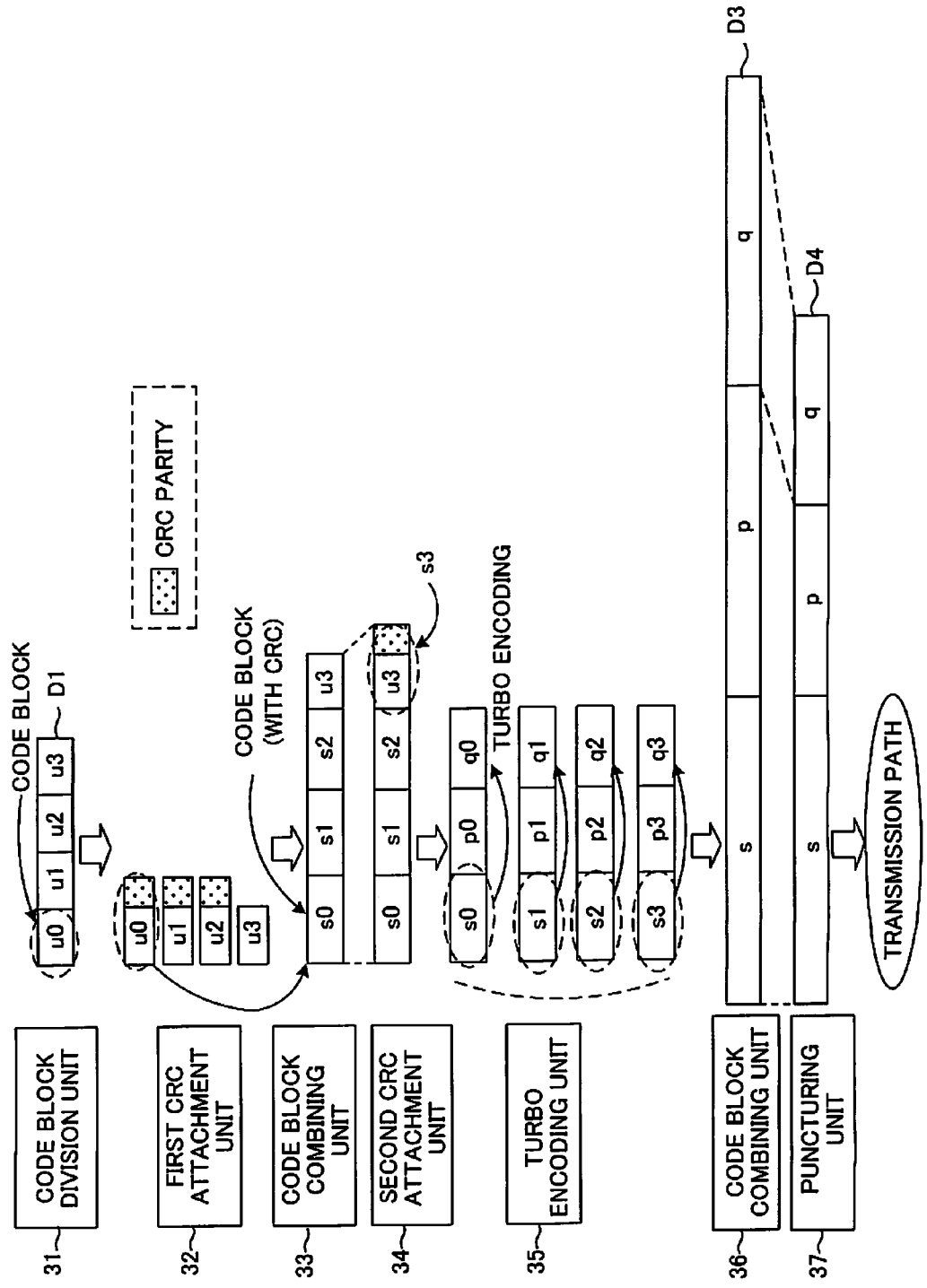
FIG. 21 is a drawing for explaining the processing by a transmission device.

FIG. 21 is a drawing for explaining the theory of a transmitting device, where, after receiving information data D1 to be transmitted from a host layer in frame units, a code block division unit 31 divides the information data D1 into plural code blocks, here four code blocks u0, u1, u2 and u3 (code block segmentation). Next, a first CRC attachment unit 32 attaches CRC bits to block units for the first three code blocks u0, u1 and u2 in order for error detection (CRC attachment), and generates code blocs s0, s1 and s2. Then a code block combining unit 33 combines the three code blocks s0, s1 and s2 to which CRC have been attached with the code block u3 to which CRC has not been attached, and a second CRC attachment unit 34 attaches CRC bits to the entire block for error detection (CRC attachment). A code block s3 is generated from the code block u3 and the entire CRC. A turbo encoding unit 35 performs a turbo encoding process to encode each of the code blocks s0, s1, s2 and s3. By doing this, code block s0 becomes a turbo encoded code block (s0, p0, q0), code block s1 becomes a turbo encoded code block (s1, p1, q1), code block s2 becomes a turbo encoded code block (s2, p2, q2), and code block s3 becomes a turbo encoded code block (s3, p3, q3). A code block combining unit 36 divides each of the encoded code blocks that are output from the turbo encoding unit 35 into systematic bits si (i=0 to 3), parity bits pi and parity bits qi, and links similar items together. A puncturing unit 37 performs puncturing of parity p and parity q so that the entire bit length of the data D3 of combined code blocks becomes a specified sized in the event that it is greater than that specified size. After that, a physical channel separation unit (not shown in the figure) separates the punctured data D4 into physical channels (Physical channel segmentation), performs specified processing of each, and inputs the resulting data to a modulation unit.

Figure 22:
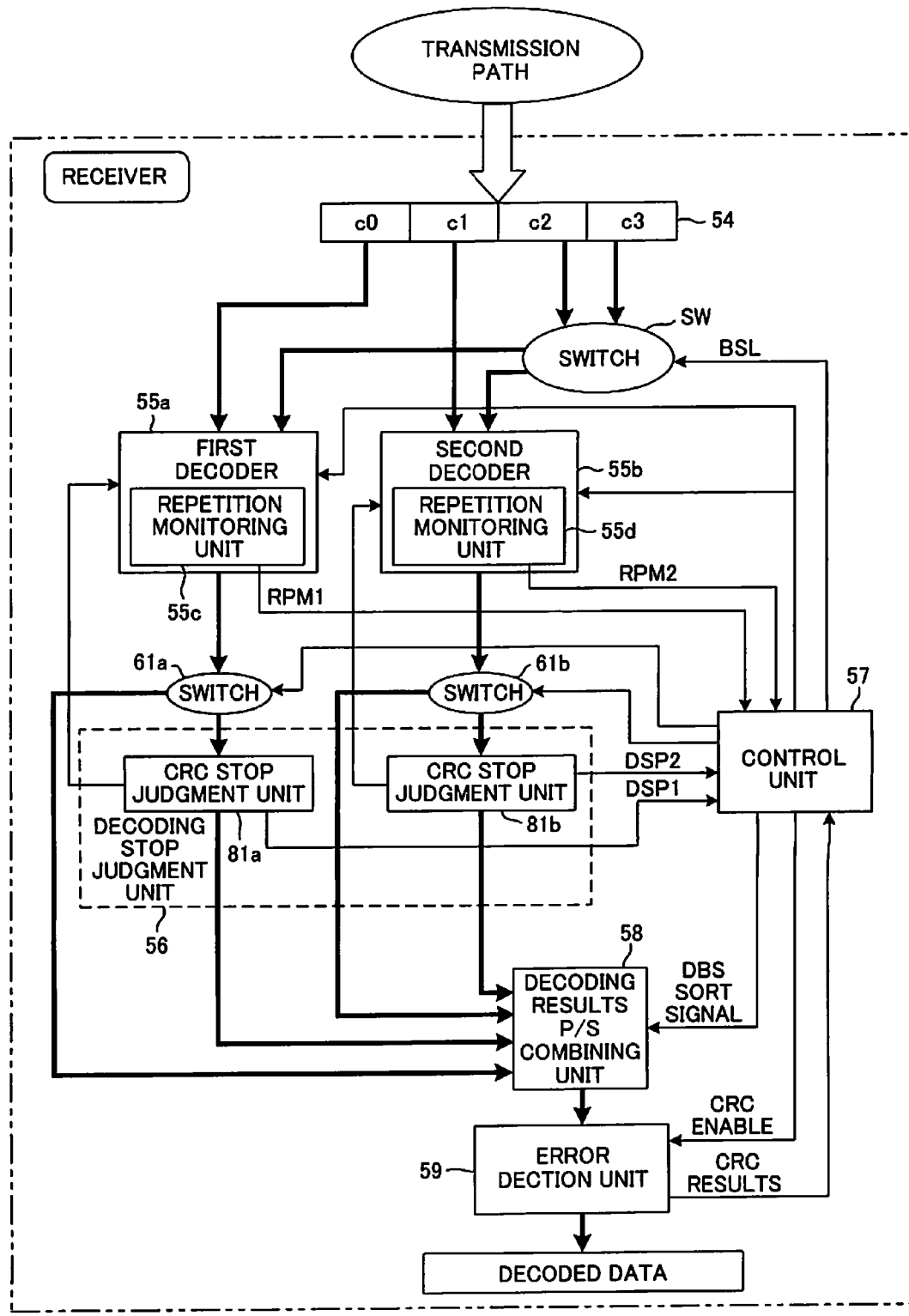
FIG. 22 is a block diagram showing the main parts of a receiving device of a seventh embodiment.
Figure 23:
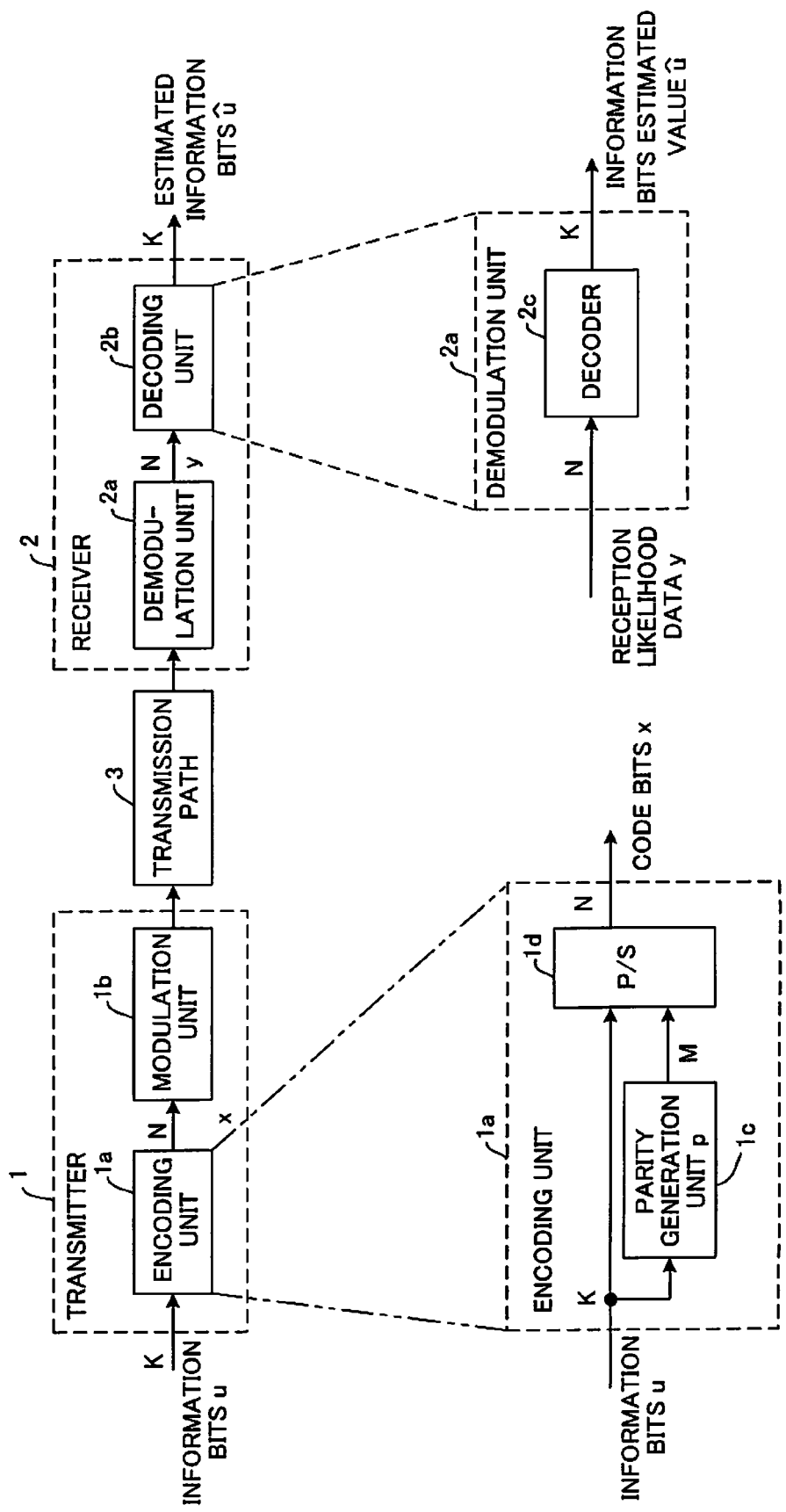
FIG. 23 shows an example of a communication system.
Figure 24:
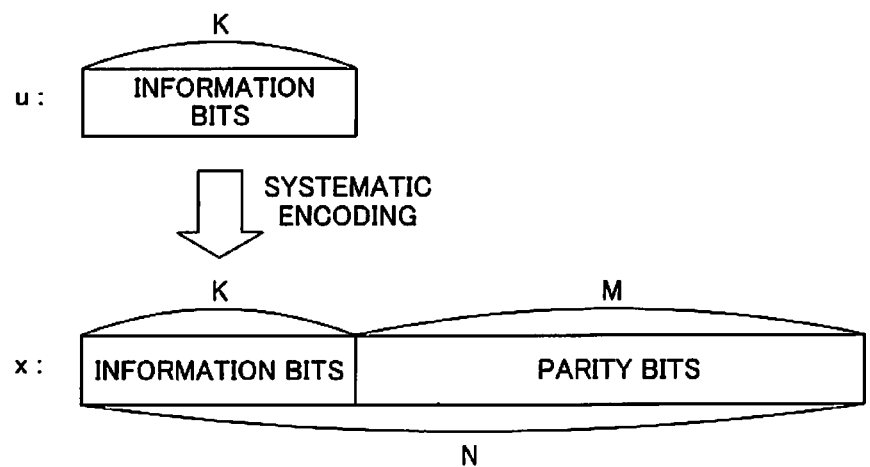
FIG. 24 is a drawing for explaining encoding.
Figure 25:
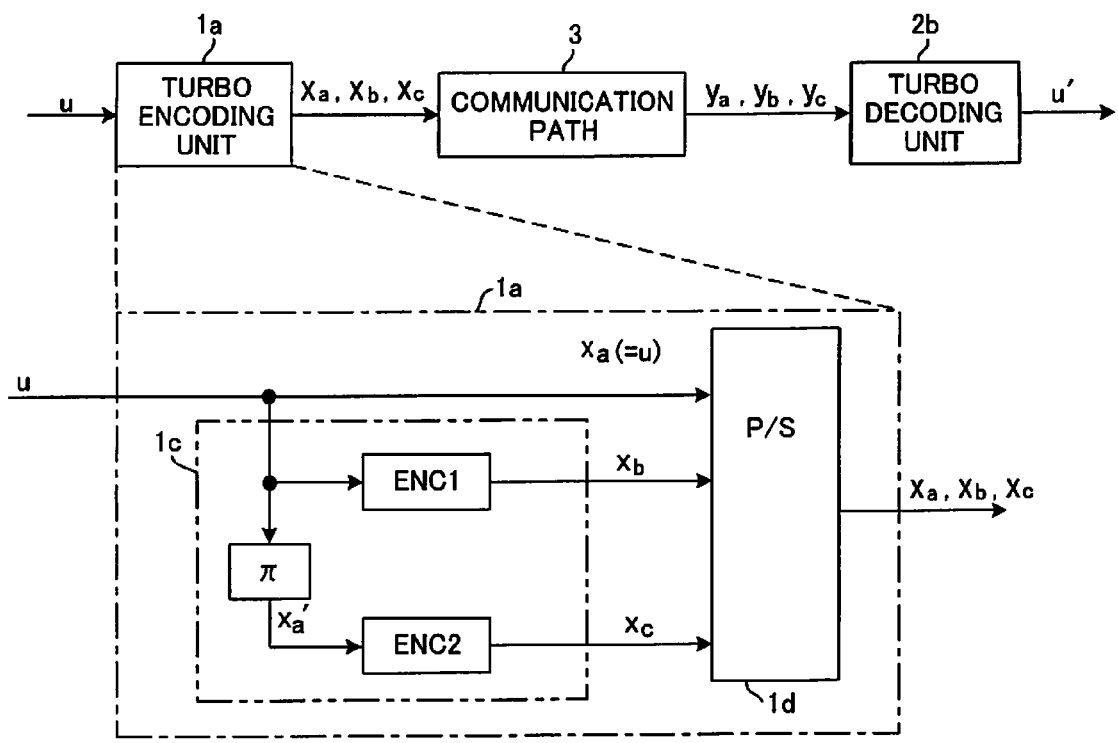
FIG. 25 is a schematic diagram of a turbo encoding unit.
Figure 26:
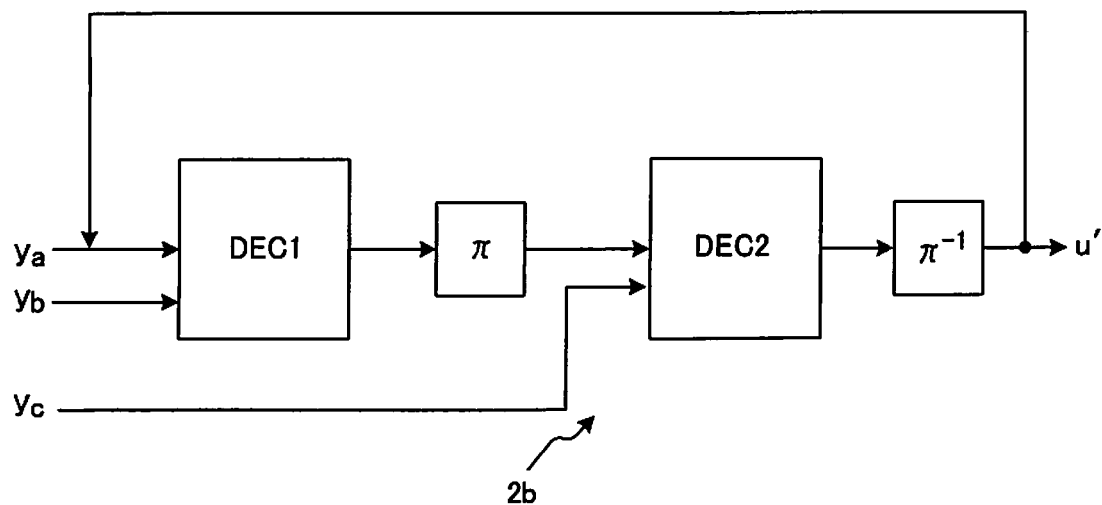
FIG. 26 is a schematic diagram of a turbo decoding unit.

FIG. 22 is a block diagram of the main parts of a receiving device of a seventh embodiment of the invention, where the same reference numbers are used for parts that are the same as those of the second embodiment shown in FIG. 6. This embodiment differs in that the decoding stop judgment units 56$a$, 56$b$ comprise CRC stop judgment units 81$a$, 81$b$. The CRC stop judgment units 81$a$, 81$b$ execute an error detection process that uses CRC code that is included in the code block decoding results, and when no errors are detected, regard that the conditions for stopping decoding have been met and outputs the decoding stop signals DSP1, DSP2. The processing by the control unit 57 is the same as the processing flow shown in FIG. 7.

According to the seventh embodiment when there is CRC code included in the code blocks, it is possible to use that CRC code to perform decoding stop judgment. Moreover, according to the seventh embodiment, the same effect as the second embodiment can be obtained.

According to the embodiments described above, it is possible for one decoder to perform decoding processing for a plural code blocks, as well as it is possible to reduce the number of decoders mounted and increase the number of time decoding is repeated per decoder for the input data, so it is possible to maintain or improve the error characteristics.

What is claimed is:

1. A decoding method for a receiving device in a communication system in which a transmitter separates one frame of information bits into a plurality of blocks, encodes the information bits of each block to generate encoded information bits using code that reduces errors in the decoding results each time decoding process is repeated and transmits the encoded information bits of the plurality of blocks including bits for an error detection code, and the receiving device receives the data corresponding to the encoded information bits of each block and the bits for the error detection code and decodes the received data corresponding to the encoded information bits to the information bits before encoding, comprising:

configuring a receiving device with a plurality of decoders, the number of which being less than the number of blocks per frame, and presetting a maximum number of repetitions that decoding is performed by each decoder for each frame;

expressing the received data corresponding to the encoded information bits of each of said plurality of blocks using likelihood;

in each decoder of said plurality of decoders, performing at first a decoding process on the received data corresponding to the encoded information bits of each of said plurality of blocks expressed by likelihood, and judging whether a condition for stopping decoding has been met after each decoding process for each of said plurality of decoders;

saving the decoding results when the condition for stopping decoding has been met at each decoder, and assigning the decoding process for the received data corresponding to the encoded information bits of one of said plurality of blocks for which the decoding process has not yet been performed, to a decoder in which the condition for stopping decoding has been met;

serially combining the decoding result of each of said plurality of blocks when the condition for stopping decoding for each of said plurality of blocks is met before the number of times the decoding process has been repeated by each decoder exceeds said preset maximum number of repetitions, and performing an error detection process using the received error detection code on the combined decoding results; and outputting the combined decoding results when there were no errors detected in the error detection process.

2. The decoding method of claim 1 further comprising:
measuring the reliability of the received data corresponding to the encoded information bits expressed by likelihood for each block; and in each decoder performing a decoding process on the received data corresponding to the encoded information bits of each block based on the reliability.

3. The decoding method of claim 2 wherein
said reliability is the average value of absolute values of the received data corresponding to the encoded information bits expressed by likelihood in a block of interest.

4. The decoding method of claim 1 comprising:
in each decoder repeating the decoding process for each assigned block in order until the number of times decoding has been repeated reaches the preset maximum number of repetitions when an error is detected in said error detection process;

serially combining the decoding result of each block after the number of times the decoding process has been repeated has reached the preset maximum number of repetitions, and performing an error detection process on the combined decoding results; and outputting the serially combined decoding results when no errors are detected in the error detection process.

5. The decoding method of claim 1 comprising:
serially combining the decoding result of a remaining block with decoding results of other blocks after the conditions for stopping decoding have been met for all blocks except one remaining block every time decoding process has been performed for the remaining block; and performing an error detection process for the combined decoding results and outputting the serially combined decoding results when no errors are detected in the error detection process.

6. The decoding method of claim 1, wherein
said error detection process is executed by using error detection code that is included in one frame of information bits.

7. The decoding method of claim 1, wherein
after the decoding process becomes possible for the encoded information bits of each block, the decoders are caused to start the decoding process in order, and the maximum number of repetitions is increased more the earlier a decoder starts decoding.

8. The decoding method of claim 5, wherein the transmission device attaches error detection codes to all of the blocks except one block, and then attaches one error detection code to the entire frame, and the receiving device uses that error detection code to determine whether the condition for stopping decoding of each block is met and judge whether said decoding results should be output.

9. The decoding method of claim 1, wherein
said decoder performs the decoding process by dividing the received data corresponding to the encoded information bits of each received block into plural divisions, performing decoding in parallel for each division of information bits, and collecting together the plural decoding results.

10. The decoding method of claim 1, wherein
said judgment step judges that said condition for stopping decoding has been met when the current decoding result is the same as the previous decoding result.

11. A receiving device in a communication system in which a transmitter separates one frame of information bits into a plurality of blocks, encodes the information bits of each block to generate encoded information bits using code that reduces errors in the decoding results each time decoding process is repeated and transmits the encoded information bits of the plurality of blocks including bits for an error detection code, and the receiving device receives the data corresponding to the encoded information bits of each block and the bits for the error detection code, and decodes the encoded information bits to the information bits before encoding, comprising:

a demodulation unit that demodulates and outputs the received data corresponding to the encoded information bits for each of said plurality of blocks as likelihood data;

a separation unit that separates one frame of said likelihood data into said plurality of blocks and saves the likelihood data of each of said plurality of blocks in a buffer unit;

a decoding unit configured with a plurality of decoders, the number of which being less than the number of blocks per frame, where each decoder performs a decoding process on the received data corresponding to the encoded information bits expressed by likelihood for each of said plurality of blocks and saved in the buffer unit;

a decoding stop judgment unit that judges whether a condition for stopping decoding has been met after each decoding process by each of said plurality of decoders;

a control unit that controls at first each of said plurality of decoders to perform a decoding process on the received data corresponding to the encoded information bits of each of said plurality of blocks expressed by likelihood, and assigns decoding process for the received data corresponding to the encoded information bits of one of said plurality of decoders for which decoding has not yet been performed, to a decoder in which the condition for stopping decoding has been met;

a decoding results combining unit that serially combines the decoding result of each block when the condition for stopping decoding for each of said plurality of blocks is met before the number of times the decoding has been repeated by each of said plurality of decoders exceeds a preset maximum number of repetitions for each frame; and an error detection unit that performs an error detection process on the combined decoding results using the received error detection code, and when no error is found in the error detection process, outputs said combined decoding results.

12. The receiving device of claim 11, further comprising
a reliability measurement unit that measures the reliability of the received data corresponding to the encoded information bits that are expressed by likelihood for each block; wherein
said control unit assigns the decoding process of each of the blocks to the decoders in order of blocks having the lowest reliability.

13. The receiving device of claim 12, wherein
said reliability measurement unit outputs the average value of absolute values of the received data corresponding to the encoded information bits that are expressed by likelihood for each block as the reliability.

14. The receiving device of claim 11, wherein
said control unit controls the decoding process of each decoder so that each decoder repeats the decoding process for each assigned block in order until the number of times that decoding is repeated reaches said preset maximum number of repetitions when an error is detected in said error detection process;
said decoding results combining unit serially combines the decoding result for each block after the number of times the decoding process has been repeated reaches the preset maximum number of repetitions; and
said error detection unit performs an error detection process on the combined decoding results, and when no error is detected in the error detection process, outputs the serially combined decoding results.

15. The receiving device of claim 11, wherein
when the conditions for stopping decoding are met for all of the code blocks except for one remaining block, said decoding results combining unit serially combines the decoding result of the remaining block with the decoding results of the other blocks every time the decoding process is performed for the remaining block; and
said error detection unit performs an error detection process on the combined decoding results, and when no errors are detected in the error detection process, outputs the serially combined decoding results.

16. The receiving device of claim 11, wherein
after the decoding process becomes possible for the received data corresponding to the encoded information bits of each block, said control unit causes the decoders to start the decoding process in order, and increases the maximum number of repetitions of the decoder that starts the decoding process at first more than the maximum number of repetitions of other decoders.

17. The receiving device of claim 11, wherein
the transmission device attaches error detection codes to all of the blocks except one block, and then attaches one error detection code to the entire frame, and said decoding stop judgment unit and error detection unit use the error detection codes to determine whether the condition for stopping decoding of each block is met and judge whether said decoding results should be output.

18. The receiving device of claim 11, wherein
said decoder performs the decoding process by dividing the received data corresponding to the encoded information bits of each received block into plural divisions, performing decoding in parallel for each division of information bits, and collecting together the plural of decoding results.

19. The receiving device of claim 11, wherein
said decoding stop judgment unit judges that said condition for stopping decoding has been met when the current decoding result is the same as the previous decoding result.

* * * * *